(12) United States Patent
Oguma et al.

(10) Patent No.: US 10,507,734 B2
(45) Date of Patent: Dec. 17, 2019

(54) BATTERY STATE ESTIMATING APPARATUS

(71) Applicant: TOYOTA JIDOSHA KABUSHIKI KAISHA, Toyota-shi, Aichi-ken (JP)

(72) Inventors: Yasumasa Oguma, Tokyo-to (JP); Tetsuya Osaka, Tokyo (JP); Shingo Tsuda, Tokyo (JP); Kazuaki Utsumi, Tokyo (JP); Tokihiko Yokoshima, Tokyo (JP); Daikichi Mukoyama, Tokyo (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 27 days.

(21) Appl. No.: 15/888,323

(22) Filed: Feb. 5, 2018

(65) Prior Publication Data

US 2018/0222344 A1 Aug. 9, 2018

(30) Foreign Application Priority Data

Feb. 9, 2017 (JP) ................................ 2017-022259

(51) Int. Cl.
*H02J 7/00* (2006.01)
*B60L 11/18* (2006.01)
*G01R 31/382* (2019.01)
*G01R 31/389* (2019.01)

(52) U.S. Cl.
CPC ........ *B60L 11/1861* (2013.01); *G01R 31/382* (2019.01); *G01R 31/389* (2019.01); *H02J 7/0021* (2013.01); *H01M 2220/20* (2013.01)

(58) Field of Classification Search
CPC ............... H02J 7/0031; H02J 2007/004; H02J 2007/0037; Y02E 60/12; H01M 10/48
USPC ........................................................ 320/134
See application file for complete search history.

(56) References Cited

U.S. PATENT DOCUMENTS

| 2003/0184307 A1* | 10/2003 | Kozlowski ............ B60L 3/0046 324/427 |
| 2004/0157113 A1* | 8/2004 | Klang ................. G01R 31/3648 429/50 |
| 2012/0007556 A1* | 1/2012 | Matsui .................... B60L 58/18 320/112 |
| 2013/0069658 A1* | 3/2013 | Rich ..................... H01M 10/48 324/426 |
| 2013/0156072 A1 | 6/2013 | Hebiguchi |
| 2014/0229130 A1 | 8/2014 | Koba et al. |

(Continued)

FOREIGN PATENT DOCUMENTS

| EP | 2 811 310 A1 | 12/2014 |
| JP | 2014-126532 A | 7/2014 |

(Continued)

*Primary Examiner* — Arun C Williams
(74) *Attorney, Agent, or Firm* — Oliff PLC

(57) ABSTRACT

A battery state estimating apparatus is provided with: an acquirer configured to obtain a complex impedance of a battery; a calculator configured to calculate a ratio of a variation of a predetermined feature amount regarding the complex impedance; and an estimator configured to estimate a charge amount of the battery on the basis of the ratio of the variation of the predetermined feature amount with respect to an integrated current value, which is an integrated value of an electric current flowing through the battery.

4 Claims, 22 Drawing Sheets

(56) References Cited

U.S. PATENT DOCUMENTS

| | | | |
|---|---|---|---|
| 2015/0198674 A1* | 7/2015 | Kroker | H01M 10/4257 |
| | | | 324/430 |
| 2016/0131719 A1* | 5/2016 | Takahashi | H01M 10/4285 |
| | | | 324/430 |
| 2016/0195577 A1 | 7/2016 | Osaka et al. | |

FOREIGN PATENT DOCUMENTS

| | | |
|---|---|---|
| JP | 2016-166880 A | 9/2016 |
| WO | 2013/018641 A1 | 2/2013 |
| WO | 2013/114669 A1 | 8/2013 |

* cited by examiner

BATTERY STATE ESTIMATING APPARATUS

CROSS-REFERENCE TO RELATED APPLICATIONS

This application is based upon and claims the benefit of priority of the prior Japanese Patent Application No. 2017-022259, filed on Feb. 9, 2017, the entire contents of which are incorporated herein by reference.

BACKGROUND OF THE INVENTION

1. Field of the Invention

Embodiments of the present invention relate to a battery state estimating apparatus configured to estimate a state of a battery, which is mounted on a vehicle or the like.

2. Description of the Related Art

For this type of apparatus, there is known an apparatus configured to estimate a charge amount, a degradation state, or the like of a battery by analyzing an impedance of the battery. For example, in International Publication No. WO2013/114669, there is proposed a technique/technology in which the charge amount of the battery is detected from a slope angle of a straight line connecting two or more complex impedances with different frequencies.

Moreover, as a method of calculating the impedance of the battery, for example, Japanese Patent Application Laid Open No. 2014-126532 discloses a technique/technology in which Fourier transform is performed on a response signal to an inputted rectangular wave signal, and in which impedance characteristics of an electrochemical cell are calculated on the basis of calculated frequency characteristics.

The impedance of the battery varies depending on the degradation state of the battery. Thus, a new battery and a degraded battery (e.g. a battery having a reduced charge amount due to long-term use) have a difference in the charge amount of the battery (e.g. a state of charge (SOC)) even when they have the same value for a slope of the impedance of the battery.

In this case, in order to accurately estimate the charge amount of the battery from the slope of the impedance of the battery, it is also required to estimate the degradation state of the battery (e.g. state of health (SOH)). Specifically, it is required to update a relation between the slope of the impedance and the charge amount, in accordance with the degradation state of the battery. This results in an advanced and complicated process of estimating the charge amount of the battery, which is technically problematic.

SUMMARY

In view of the aforementioned problems, it is therefore an object of embodiments of the present invention to provide a battery state estimating apparatus configured to accurately estimate the charge amount of a battery from the impedance of the battery, independently of the degradation state of the battery.

<1>

The above object of embodiments of the present invention can be achieved by a battery state estimating apparatus provide with: an acquirer configured to obtain a complex impedance of a battery; a calculator configured to calculate a ratio of a variation of a predetermined feature amount from the complex impedance; and an estimator configured to estimate a charge amount of the battery on the basis of the ratio of the variation of the predetermined feature amount with respect to an integrated current value, which is an integrated value of an electric current flowing through the battery.

According to the battery state estimating apparatus in embodiments of the present invention, the charge amount of the battery (e.g. a SOC) is estimated on the basis of the ratio of the variation of the predetermined feature amount with respect to the integrated current value of the battery. The predetermined feature amount is a parameter that can be calculated from the complex impedance of the battery.

According to studies by the present inventors, it has been found that the ratio of the variation of the predetermined feature amount with respect to the integrated current value of the battery and the charge amount of the battery have a substantially constant relation, regardless of the degradation state of the battery. It is thus possible to accurately estimate the charge amount, regardless of the degradation state of the battery, by using the ratio of the variation of the predetermined feature amount with respect to the integrated current value of the battery.

<2>

In one aspect of the battery state estimating apparatus according to embodiments of the present invention, the calculator is configured to calculate the ratio of the variation of the predetermined feature amount by using a real component of the complex impedance for the predetermined feature amount.

According to this aspect, it is possible to accurately estimate the charge amount of the battery on the basis of the ratio of the variation of the real component of the complex impedance with respect to the integrated current value of the battery.

<3>

In another aspect of the battery state estimating apparatus according to embodiments of the present invention, the calculator is configured to calculate the ratio of the variation of the predetermined feature amount by using an imaginary component of the complex impedance for the predetermined feature amount.

According to this aspect, it is possible to accurately estimate the charge amount of the battery on the basis of the ratio of the variation of the imaginary component of the complex impedance with respect to the integrated current value of the battery.

<4>

In another aspect of the battery state estimating apparatus according to embodiments of the present invention, the calculator is configured to calculate the ratio of the variation of the predetermined feature amount by using an absolute value of the complex impedance for the predetermined feature amount.

According to this aspect, it is possible to accurately estimate the charge amount of the battery on the basis of the ratio of the variation of the absolute value of the complex impedance with respect to the integrated current value of the battery.

<5>

In another aspect of the battery state estimating apparatus according to embodiments of the present invention, the calculator is configured to calculate the ratio of the variation of the predetermined feature amount by using, for the predetermined feature amount, a slope of a straight line connecting an origin on a complex plane and a value of the complex impedance at a first predetermined frequency, the complex plane having an axis that is a real component of the complex impedance and an axis that is an imaginary component of the complex impedance.

According to this aspect, it is possible to accurately estimate the charge amount of the battery on the basis of the ratio of the variation of the slope of the straight line (or an approximate straight line), which connects the origin on the complex plane and the value of the complex impedance at the first predetermined frequency, with respect to the integrated current value of the battery.

<6>

In another aspect of the battery state estimating apparatus according to embodiments of the present invention, the acquirer is configured to obtain a plurality of complex impedances at a plurality of different temperatures, and the calculator is configured to calculate the ratio of the variation of the predetermined feature amount by using, for the predetermined feature amount, a slope of a straight line connecting values of the obtained plurality of complex impedances at a second predetermined frequency on a complex plane having an axis that is a real component of the complex impedance and an axis that is an imaginary component of the complex impedance.

According to this aspect, the plurality of complex impedances are obtained at the plurality of different temperatures, and the slope of the straight line (or an approximate straight line) connecting the values of the plurality of complex impedances at the second predetermined frequency is calculated as the predetermined feature amount.

According to the studies by the present inventors, it has been found that the predetermined feature amount calculated in the above manner does not have a temperature dependence, even though the complex impedance originally has the temperature dependence. In this aspect, it is thus possible to eliminate not only an influence of the degradation state of the battery, but also an influence of the temperature dependence of the complex impedance, and it is possible to more accurately estimate the charge amount of the battery.

<7>

In the aspect in which the slope of the straight line connecting the values of the plurality of complex impedances at the second predetermined frequency is calculated as the predetermined feature amount, the battery state estimating apparatus may be further provided with: a determinator configured to determine an intersection of a straight line connecting values of the obtained plurality of complex impedances at a third predetermined frequency and the axis that is the real component, to be a reference point; and a corrector configured to correct the predetermined feature amount calculated on said calculator, to be a slope of a straight line connecting the reference point and the values of the obtained plurality of complex impedances at the second predetermined frequency.

In this case, the intersection of the straight line (or an approximate straight line) connecting the values of the plurality of complex impedances at the second predetermined frequency and the axis that is the real component is determined to be the reference point, and the predetermined feature amount is corrected on the basis of the straight line (or an approximate straight line) passing through the reference point. Specifically, the slope of the straight line (or an approximate straight line) connecting the reference point and the values of the plurality of complex impedances at the second predetermined frequency is used for the corrected predetermined feature amount (or the predetermined feature amount after correction).

According to the studies by the present inventors, it has been found that the influence of the temperature dependence of the complex impedance can be eliminated, more effectively, by correcting the predetermined feature amount in this manner. It is thus possible to more correctly estimate the charge amount of the battery by using the corrected predetermined feature amount.

<8>

In the aspect in which the predetermined feature amount is corrected, the determinator may be configured to calculate a plurality of intersections by changing the third predetermined frequency and may be configured to determine a point corresponding to a convergence value on which a distribution of the calculated plurality of intersections converges, to be the reference point.

In this case, the plurality of intersections, each of which is the intersection of the straight line connecting the values of the complex impedances at the second predetermined frequency and the axis that is the real component, are calculated by changing the third predetermined frequency. Then, the point corresponding to the convergence value on which the plurality of intersections converge may be determined to be the reference point. The expression "the distribution of the plurality of intersections converges" means that the plurality of intersections approach or come together at a point on a real number axis in a predetermined frequency range, or that the plurality of intersections are located in an extremely narrow range on the real number axis. For example, a value obtained by averaging positions of the plurality of intersections that converge in this manner may be determined to be the reference point.

As described above, it is possible to eliminate, for example, an influence of noise or the like when the complex impedance is obtained, by using the convergence value on which the distribution of the plurality of intersections converges as the reference point, and it is thus possible to correct the predetermined feature amount to a more appropriate value.

The nature, utility, and further features of this invention will be more clearly apparent from the following detailed description with reference to preferred embodiments of the invention when read in conjunction with the accompanying drawings briefly described below.

DETAILED DESCRIPTION OF THE PREFERRED EMBODIMENTS

A battery state estimating apparatus according to embodiments of the present invention will be explained with reference to the drawings.

First Embodiment

A battery state estimating apparatus 100 according to a first embodiment will be explained. The following is an example in which the battery state estimating apparatus 100 is configured to estimate a battery state associated with a battery of a vehicle.

(1) Configuration of Apparatus

Figure 1:
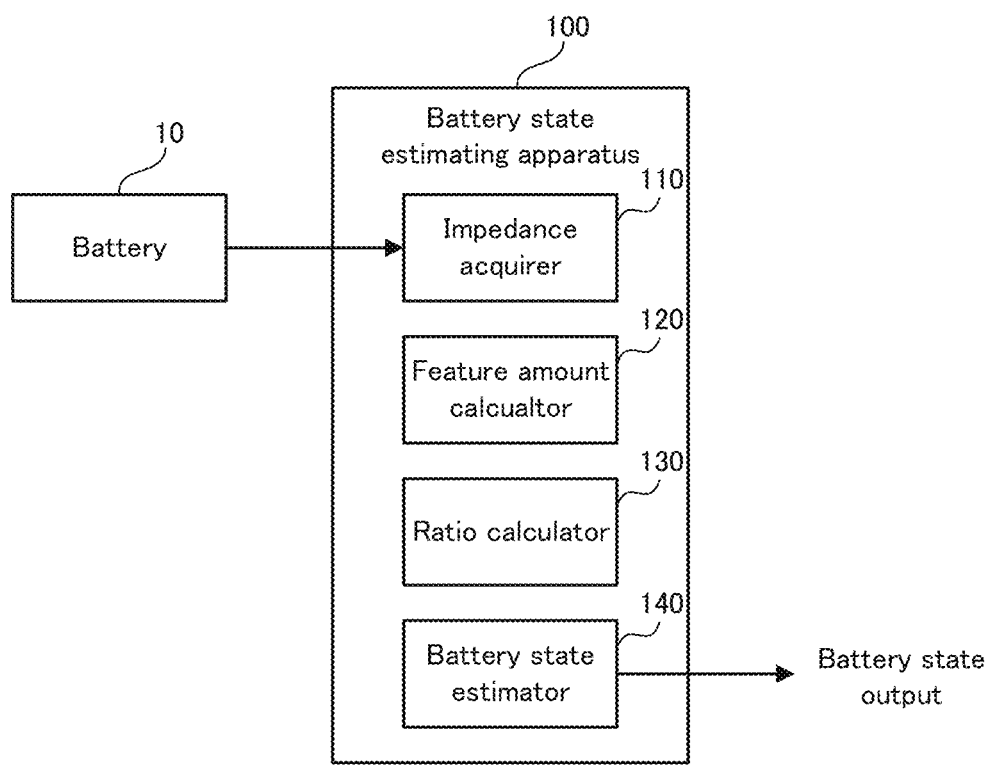
FIG. 1 is a block diagram illustrating a configuration of a battery state estimating apparatus according to a first embodiment.

Firstly, a configuration of the battery state estimating apparatus 100 according to the first embodiment will be explained with reference to FIG. 1. FIG. 1 is a block diagram illustrating the configuration of the battery state estimating apparatus 100 according to the first embodiment.

As illustrated in FIG. 1, the battery state estimating apparatus 100 according to the first embodiment is an electronic unit electrically connected to a battery 10 of a vehicle, and is configured to estimate a SOC, which is a battery state of the battery 10. The battery 10 is one specific example of the "battery", and is configured as a chargeable secondary battery, such as, for example, a lithium ion battery.

The battery state estimating apparatus 100 is provided with an impedance acquirer 110, a feature amount calculator 120, a ratio calculator 130, and a battery state estimator 140, as logical or physical processing blocks realized therein.

The impedance acquirer 110 is one specific example of the "acquirer", and is configured to obtain a complex impedance of the battery 10. The impedance acquirer 110 is configured to obtain the complex impedance, for example, by applying alternating current (AC) voltage to the battery 10 while changing frequency. A method of obtaining the complex impedance can use exiting techniques/technologies, as occasion demands, and a detailed explanation of the method will be thus omitted herein. The complex impedance of the battery 10 obtained by the impedance acquirer 110 is configured to be outputted to the feature amount calculator 120.

The feature amount calculator 120 is one specific example of the "calculator", and is configured to calculate a predetermined feature amount from the complex impedance of the battery 10. The feature amount calculated by the feature amount calculator 120 is configured to be outputted to the ratio calculator 130.

The ratio calculator 130 is configured to calculate a ratio of a variation of the predetermined feature amount (hereinafter referred to as a "variation ratio", as occasion demands) with respect to an integrated current value of the battery 10. The variation ratio calculated by the ratio calculator 130 is configured to be outputted to the battery state estimator 140.

The battery state estimator 140 is one specific example of the "estimator", and is configured to estimate the SOC from the variation ratio calculated by the ratio calculator 130. The battery state estimator 140 may estimate a specific numerical value of the SOC, or may determine whether or not the SOC reaches a predetermined reference (e.g. being close to be fully charged). The SOC to be estimated may indicate an over-charge state of exceeding 100%, or may indicate an over-discharge state of falling below 0%. The battery state estimator 140 is configured to output information about the estimated SOC of the battery 10.

(2) Explanation of Operation

Figure 2:
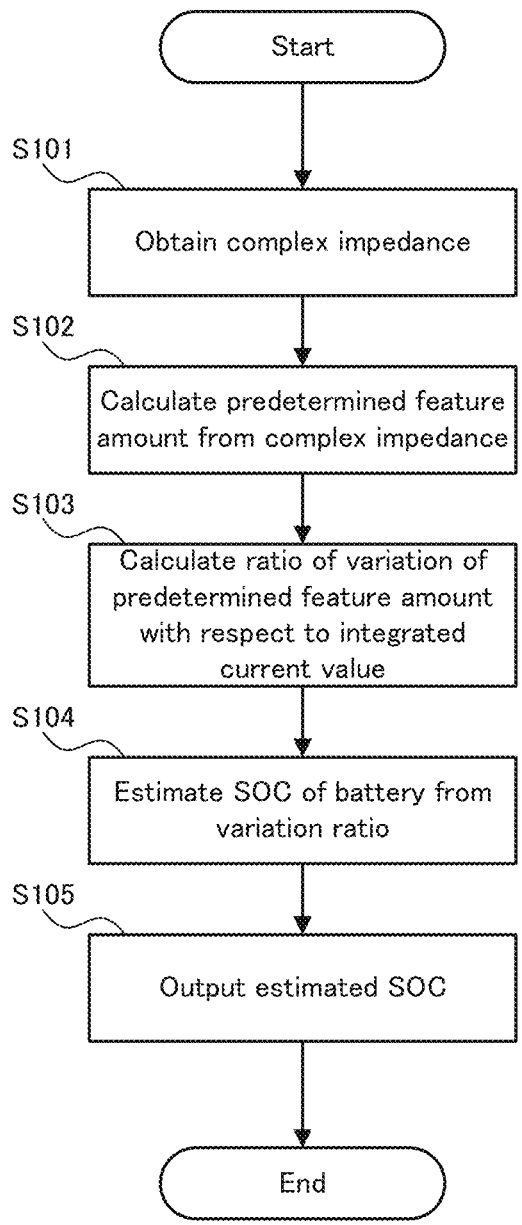
FIG. 2 is a flowchart illustrating a flow of operation of the battery state estimating apparatus according to the first embodiment.

Next, the operation of the battery state estimating apparatus 100 according to the first embodiment will be explained with reference to FIG. 2. FIG. 2 is a flowchart illustrating a flow of the operation of the battery state estimating apparatus 100 according to the first embodiment.

As illustrated in FIG. 2, in operation of the battery state estimating apparatus 100 according to the first embodiment, the impedance acquirer 110 firstly obtains the complex impedance of the battery 10 (step S101). The complex impedance may be obtained at a plurality of different times (i.e. at a plurality of times at which the battery 10 has different integrated current values).

After the acquisition of the complex impedance, the feature amount calculator 120 calculates the predetermined feature amount from the obtained complex impedance (step S102). Specifically, the predetermined feature amount may be calculated as a slope of a straight line (or an approximate straight line) connecting (i) one of a real component of the complex impedance, an imaginary component of the complex impedance, an absolute value of the complex impedance, and an origin, and (ii) a value of the complex impedance at a first predetermined frequency.

Figure 3:
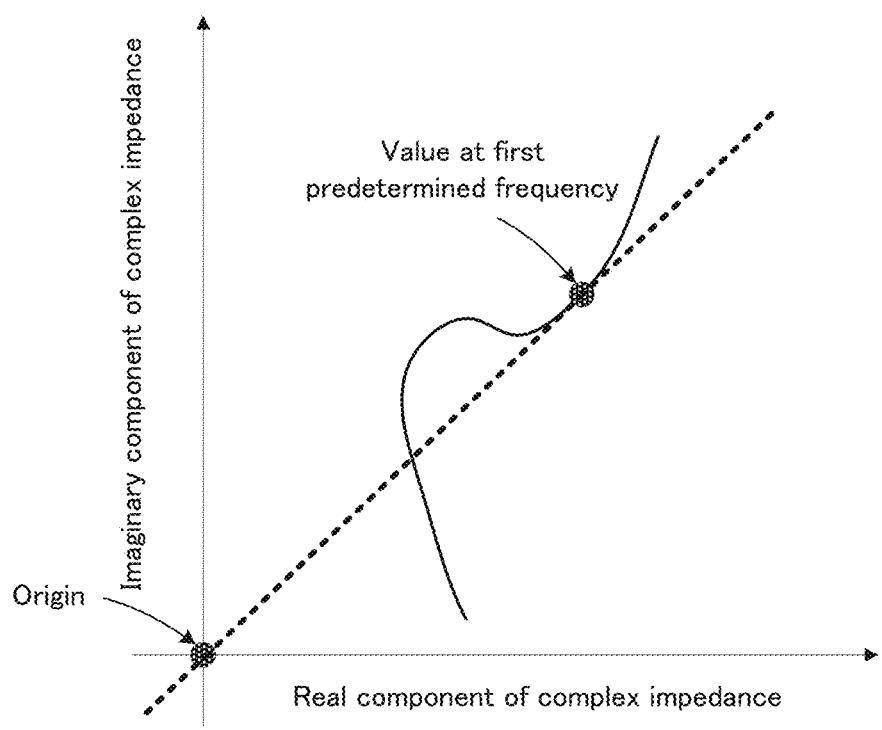
FIG. 3 is a graph illustrating a slope of a straight line connecting an origin on a complex plane and a value of a complex impedance at a first predetermined frequency.
Figure 4:
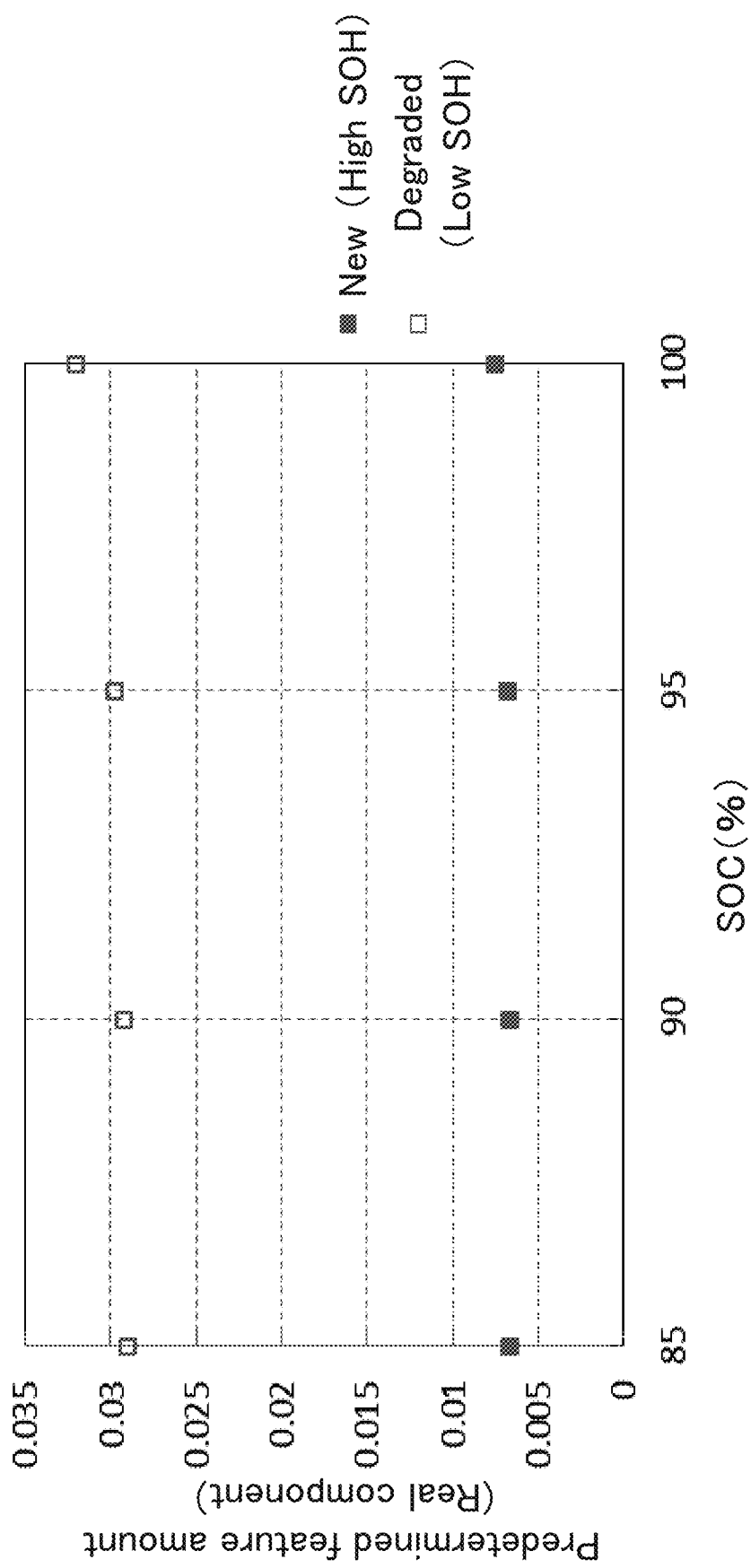
FIG. 4 is a map illustrating a relation between a real component of the complex impedance and a battery SOC.
Figure 5:
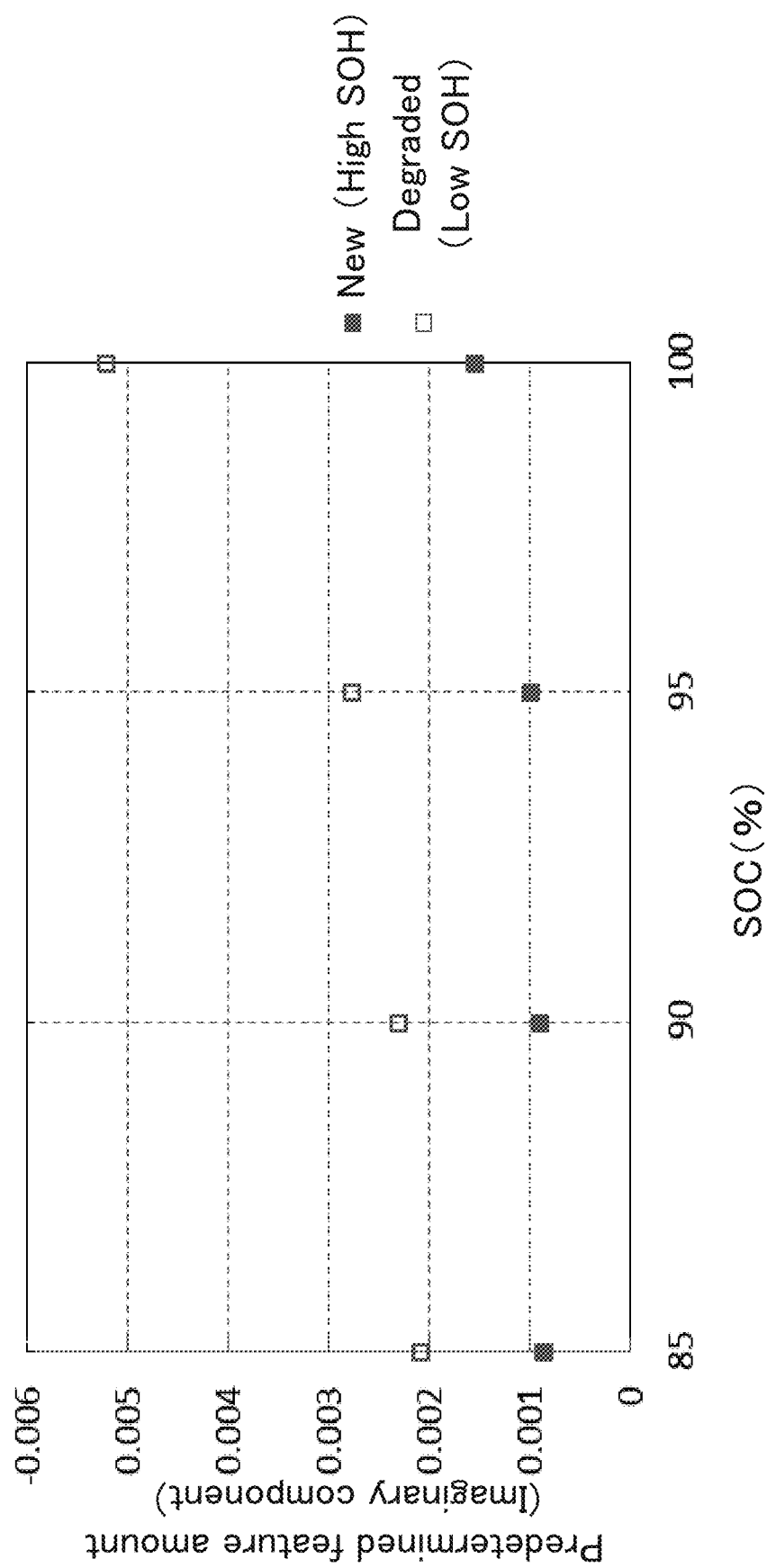
FIG. 5 is a map illustrating a relation between an imaginary component of the complex impedance and the battery SOC.
Figure 6:
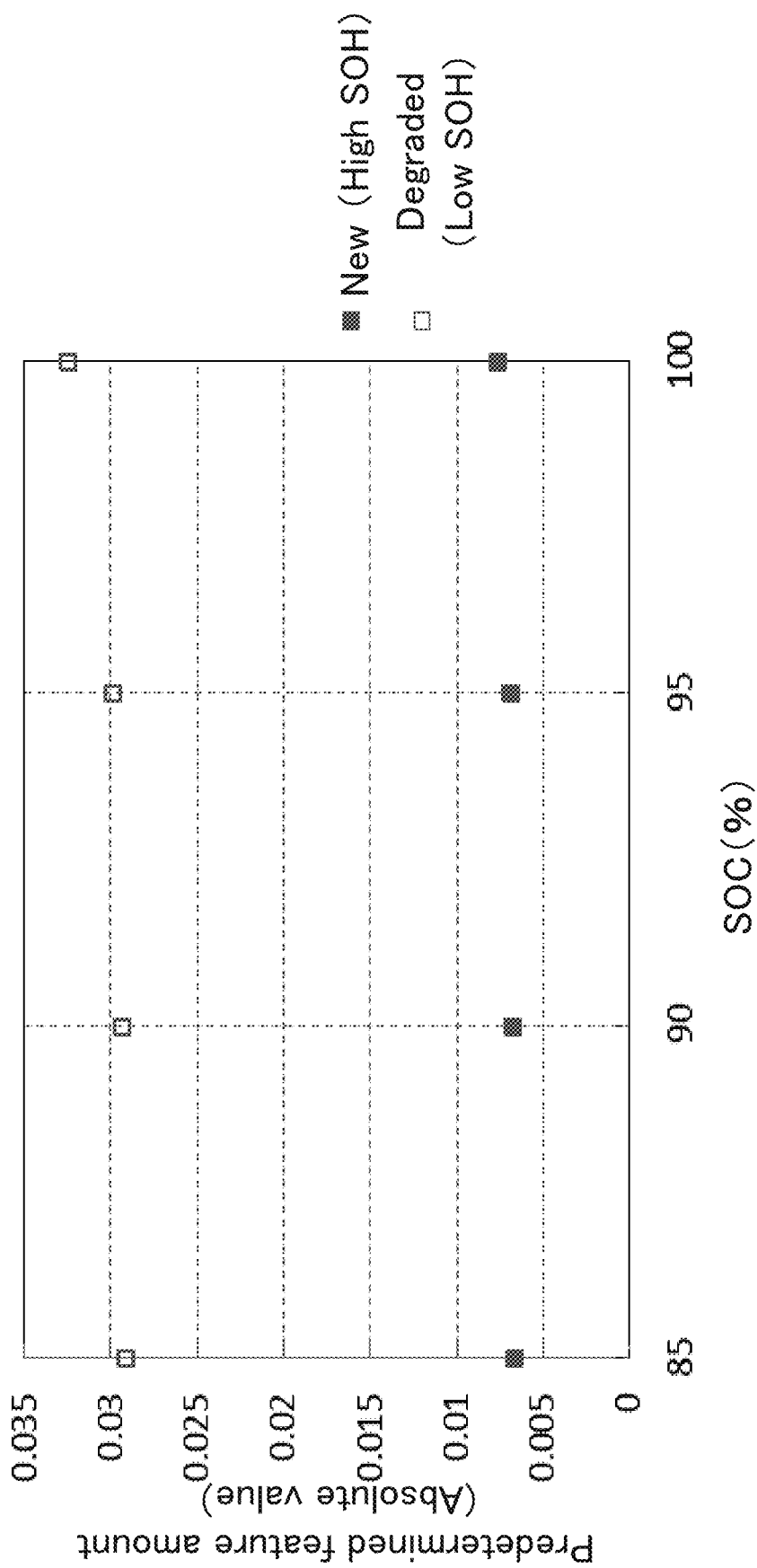
FIG. 6 is a map illustrating a relation between an absolute value of the complex impedance and the battery SOC.
Figure 7:
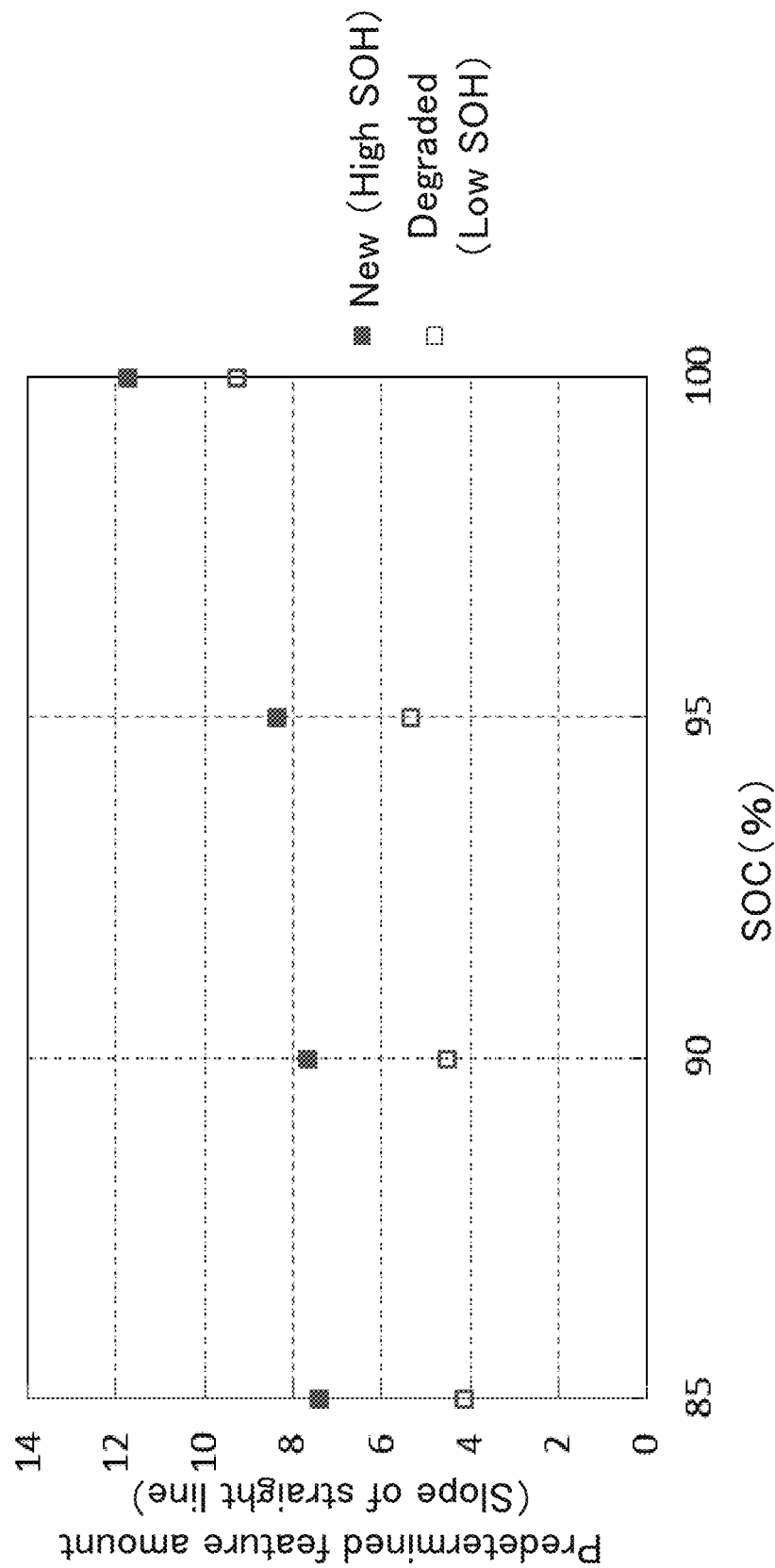
FIG. 7 is a map illustrating a relation between a slope at the origin and the battery SOC.
Figure 8:
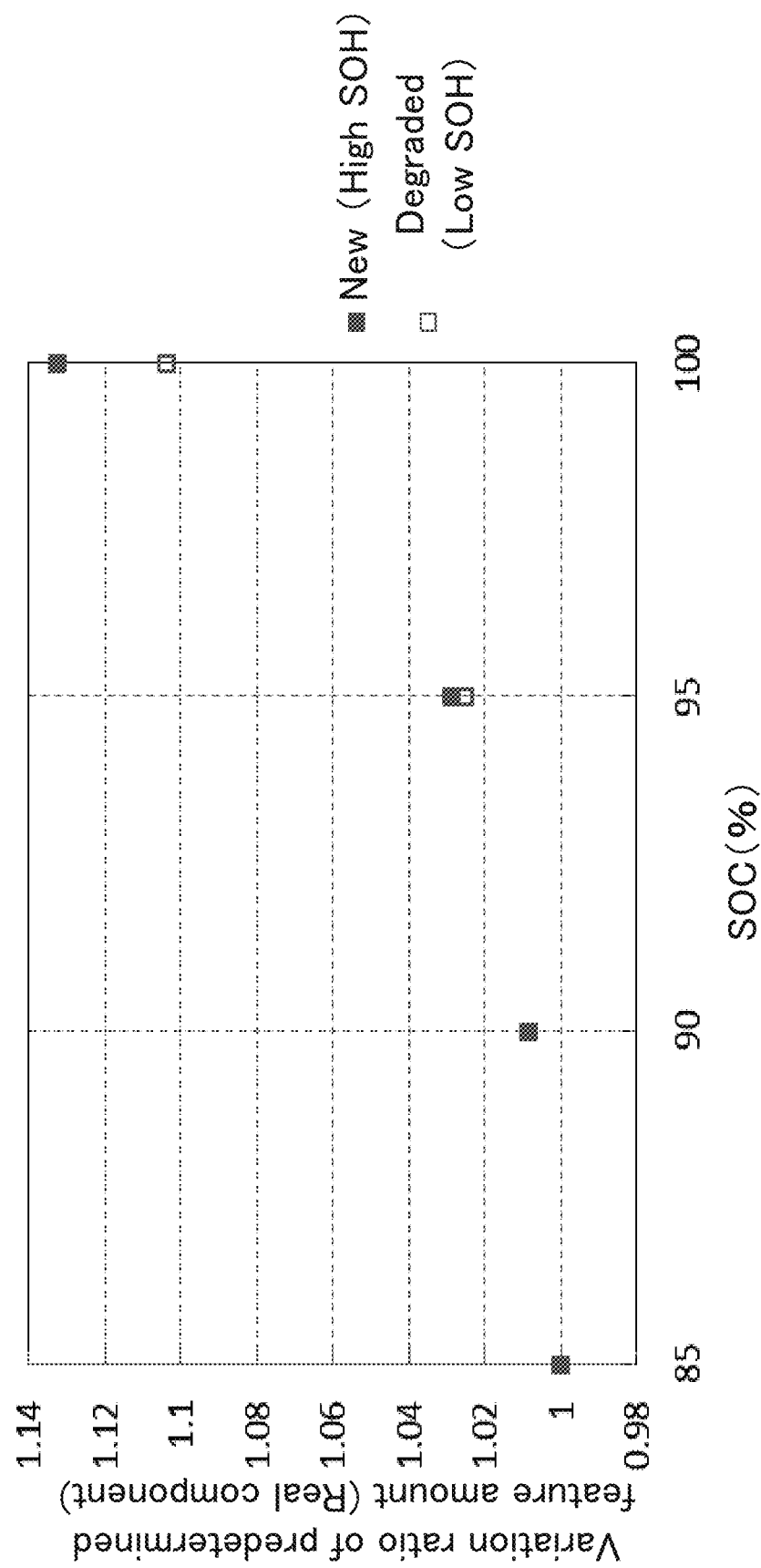
FIG. 8 is a map illustrating a relation between a variation ratio of the real component of the complex impedance and the battery SOC.
Figure 9:
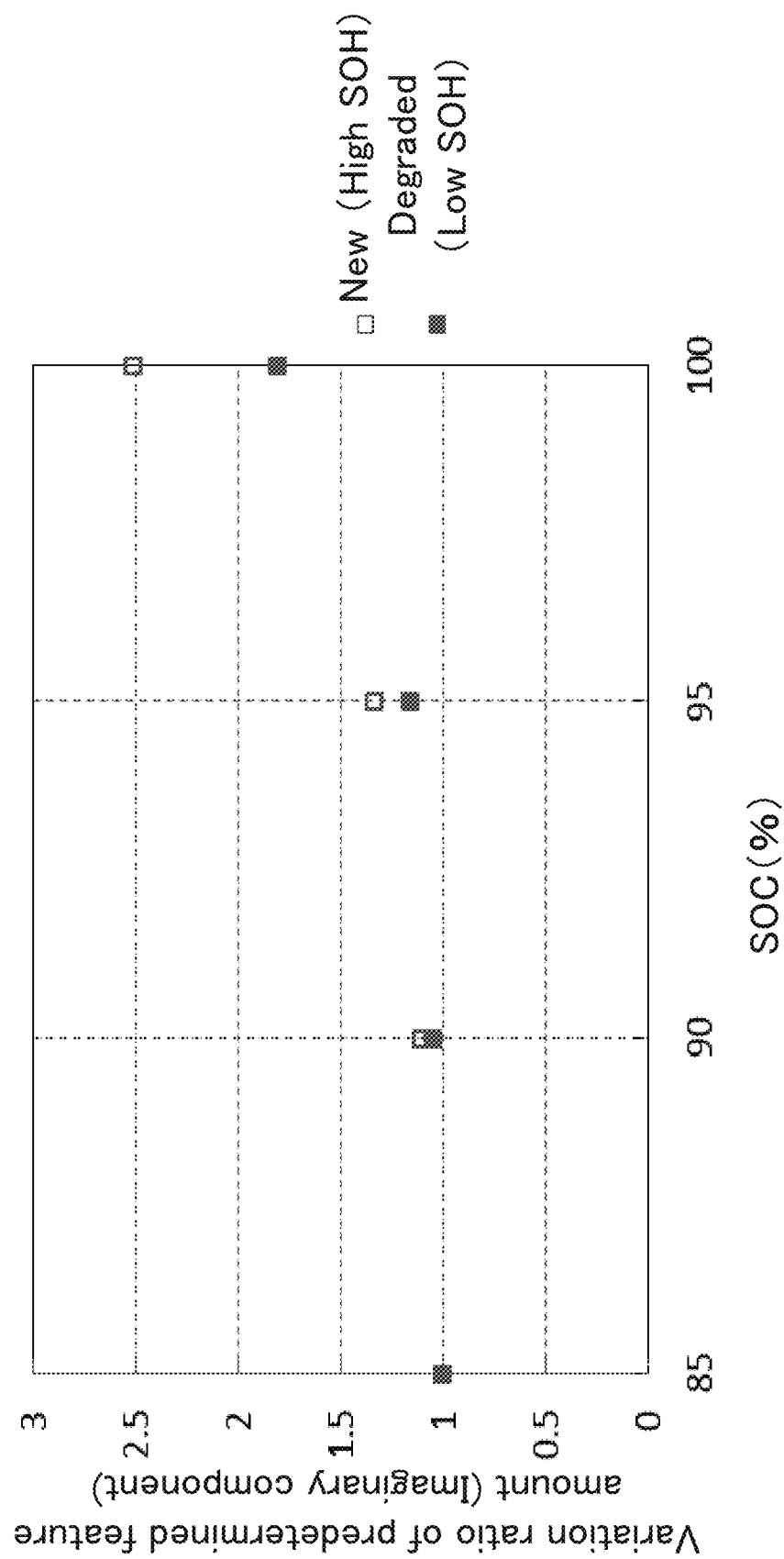
FIG. 9 is a map illustrating a relation between a variation ratio of the imaginary component of the complex impedance and the battery SOC.
Figure 10:
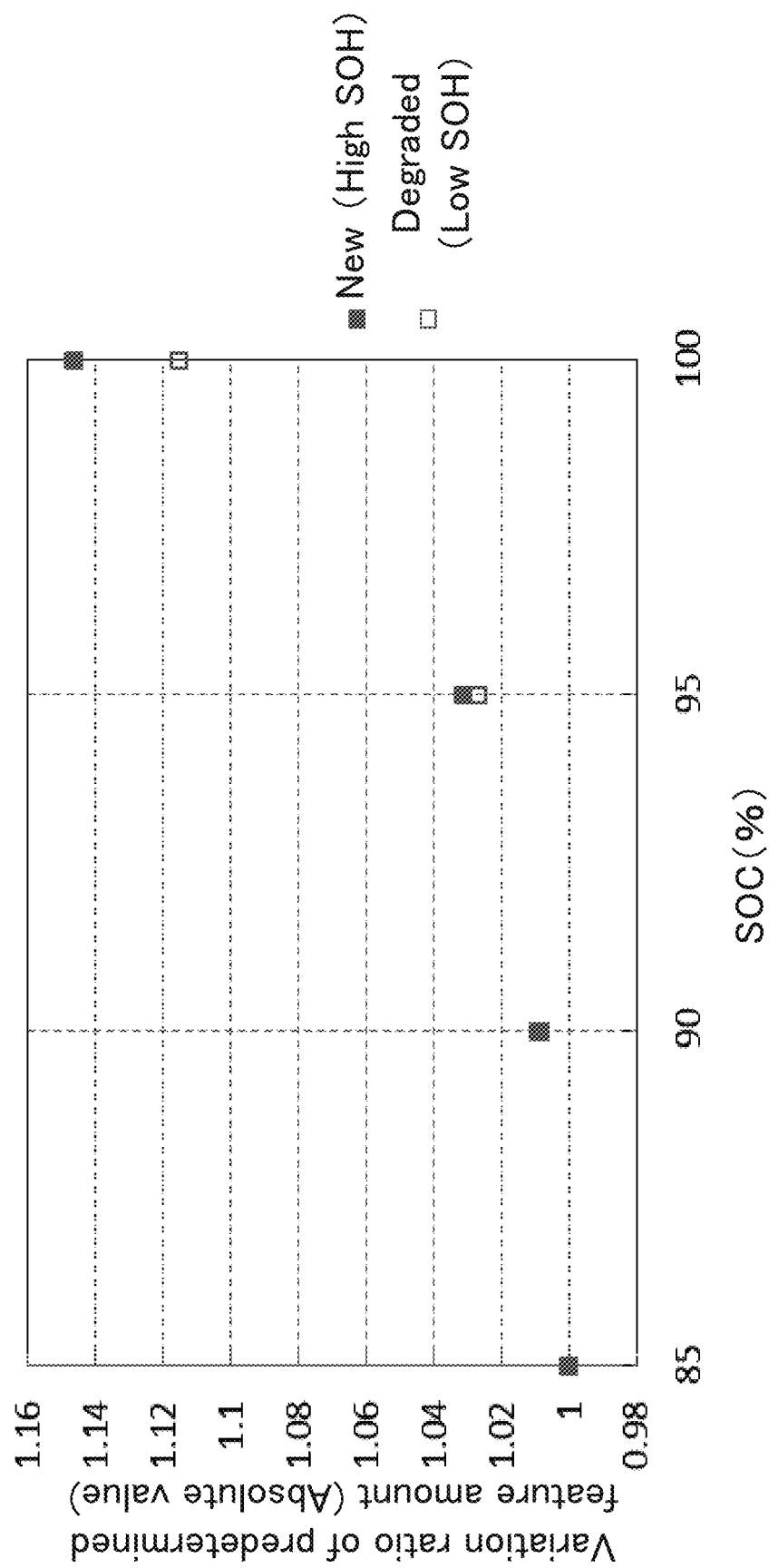
FIG. 10 is a map illustrating a relation between a variation ratio of the absolute value of the complex impedance and the battery SOC.
Figure 11:
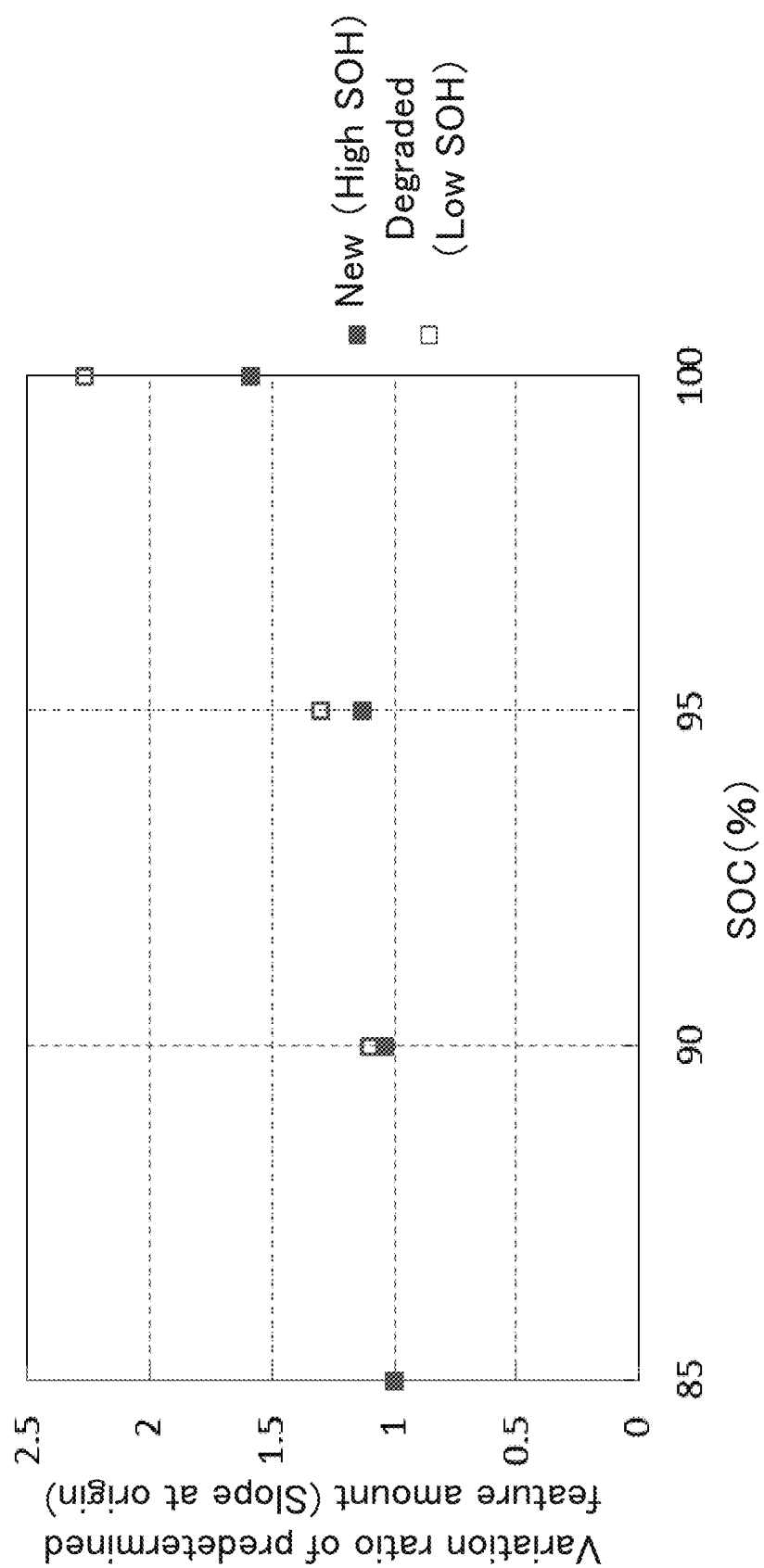
FIG. 11 is a map illustrating a relation between a variation ratio of the slope at the origin and the battery SOC.

Now, the slope of the straight line connecting the origin and the value of the complex impedance at the first predetermined frequency (hereinafter referred to as a "slope at the origin", as occasion demands) will be explained with reference to FIG. 3. FIG. 3 is a graph illustrating the slope of the straight line connecting the origin on a complex plane and the value of the complex impedance at the first predetermined frequency;

As illustrated in FIG. 3, the slope at the origin may be calculated as the slope of the straight line connecting the origin (i.e. a point at which both of the real component and the imaginary component are zero) and the value of the complex impedance at the first predetermined frequency (i.e. a straight line indicated by a dashed line in FIG. 3) when the complex impedance is plotted on the complex plane.

The first predetermined frequency may be set in advance to calculate the slope at the origin, and may be selected, as occasion demands, from a frequency range of the AC voltage that is applied to the battery 10 to obtain the complex impedance.

Back in FIG. 2, after the calculation of the predetermined feature amount, the ratio calculator 130 calculates the ratio of the variation of the predetermined feature amount with respect to the integrated current value of the battery 10 (step S103). Specifically, the variation ratio may be calculated as a value indicating to what extent the predetermined feature amount changes when the integrated current value of the battery 10 increases by a predetermined value.

After the calculation of the variation ratio, the battery state estimator 140 calculates the SOC according to the variation ratio (step S104). The battery state estimator 140 may store therein a map indicating a relation between the variation ratio and the SOC, or the like in advance, and may read the map or the like to calculate the SOC.

Lastly, the battery state estimator 140 outputs the information about the calculated SOC, to the exterior (step S105). A value of the SOC outputted, for example, may be displayed on a display that can be visually recognized by an occupant of the vehicle, or may be used for vehicle driving control.

Then, a series of steps for estimating the SOC of the battery 10 is completed, but the step S101 may be started again, for example, after a lapse of a predetermined period.

(3) Relation Between SOC and Predetermined Feature Amount

Next, a relation between the SOC of the battery 10 and the predetermined feature amount will be explained in detail with reference to FIG. 4 to FIG. 11. Each of FIG. 4 to FIG. 7 illustrates a graph indicating a relation between (i) respective one of the real component of the complex impedance, the imaginary component of the complex impedance, the absolute value of the complex impedance, and the slope at the origin, and (ii) the SOC of the battery. Each of FIG. 8 to FIG. 11 illustrates a graph indicating a relation between (i) the variation ratio of respective one of the real component of the complex impedance, the imaginary component of the complex impedance, the absolute value of the complex impedance, and the slope at the origin, and (ii) the SOC of the battery.

As illustrated in each of FIG. 4 to FIG. 7, depending on whether the battery 10 is new (i.e. a rarely degraded battery) or degraded (i.e. a degraded battery due to long-term use), a significant difference can be found in the relation between (i) respective one of the real component of the complex impedance, the imaginary component of the complex impedance, the absolute value of the complex impedance, and the slope at the origin, which are the predetermined feature amounts, and (ii) the SOC of the battery 10. It is thus hard to estimate the SOC of the battery 10 from the predetermined feature amount if a degradation state of the battery 10 (e.g. SOH) is not known.

On the other hand, as illustrated in each of FIG. 8 to FIG. 11, regardless of whether the battery 10 is new or degraded, no significant difference can be found in the relation between (i) the variation ratio of respective one of the real component of the complex impedance, the imaginary component of the complex impedance, the absolute value of the complex impedance, and the slope at the origin, which are the predetermined feature amounts, and (ii) the SOC of the battery 10. It is thus possible to estimate the SOC regardless of the degradation state of the battery 10, by using the variation ratio of the predetermined feature amount.

Particularly in a range in which the battery 10 has a SOC close to 100% (e.g. in a range of 85% to 100%) as illustrated in the drawings, the variation ratio of the predetermined feature amount significantly varies with respect to the SOC of the battery 10. Thus, in such a range, the SOC of the battery 10 can be estimated, extremely accurately, from the variation ratio of the predetermined feature amount.

As explained above, according to the battery state estimating apparatus 100 in the embodiment, it is possible to accurately estimate the SOC of the battery 10 regardless of the degradation state, by using the complex impedance of the battery 10.

Second Embodiment

A battery state estimating apparatus 200 according to a second embodiment will be explained. The second embodiment is partially different from the first embodiment in configuration and operation, and the other part is substantially the same. Thus, hereinafter, a different part from that of the first embodiment will be explained in detail, and an explanation of the same part will be omitted.

(1) Configuration of Apparatus

Figure 12:
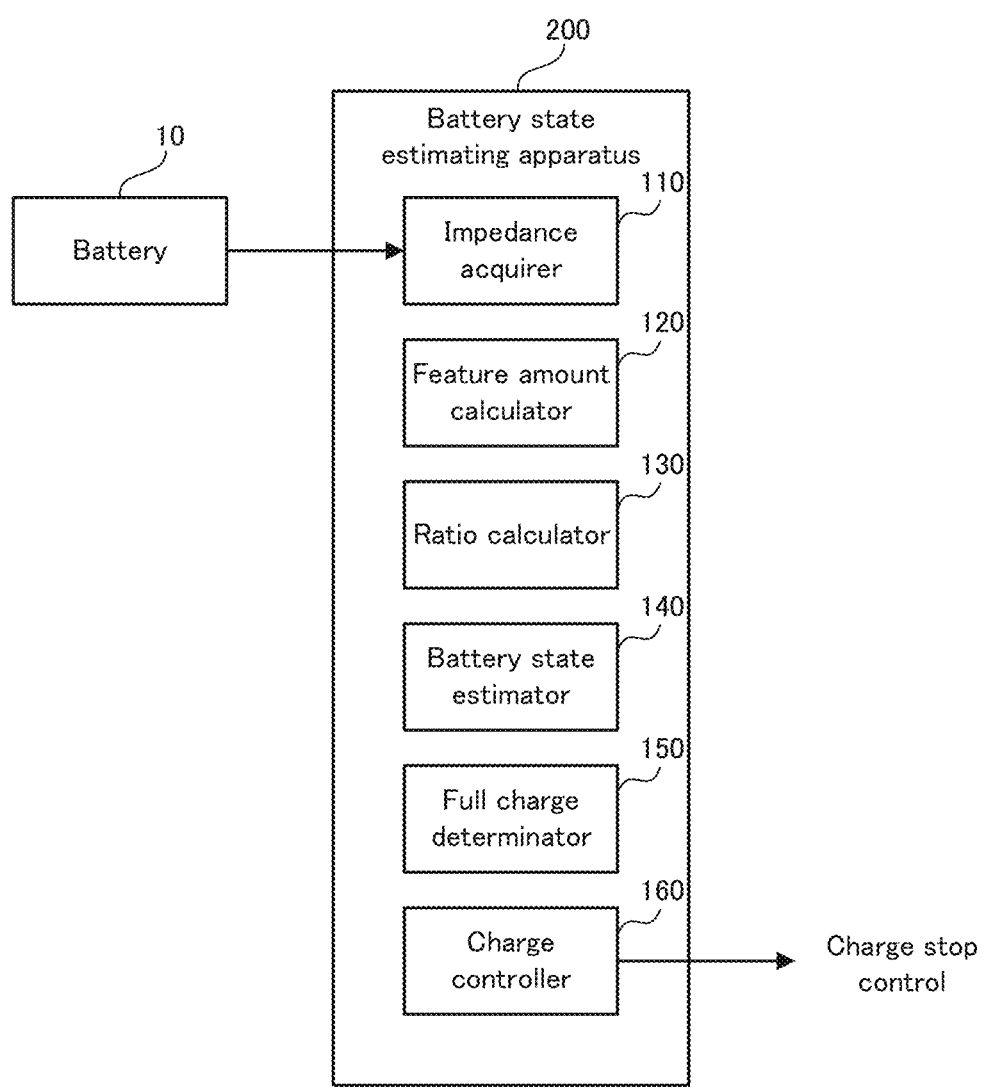
FIG. 12 is a block diagram illustrating a configuration of a battery state estimating apparatus according to a second embodiment.

Firstly, a configuration of the battery state estimating apparatus 200 according to the second embodiment will be explained with reference to FIG. 12. FIG. 12 is a block diagram illustrating the configuration of the battery state estimating apparatus 200 according to the second embodiment. FIG. 12 carries the same reference numerals as those for the same constituent elements illustrated in FIG. 1.

As illustrated in FIG. 12, the battery state estimating apparatus 200 according to the second embodiment is provided with a full charge determinator 150 and a charge controller 160, in addition to the constituent elements of the battery state estimating apparatus 100 according to the first embodiment (refer to FIG. 1). Moreover, the battery 10 according to the second embodiment is configured to be charged by charge control, which is performed by a not-illustrated charger. One example of the charger is, for example, a motor generator with a regenerative function, or the like.

The full charge determinator 150 is configured to determine whether or not the battery 10 is fully charged from the information about the SOC of the battery 10 estimated by the battery state estimator 140. The expression "fully charged or full charge" may include not only a state in which the battery 10 has a SOC of 100%, but also a state in which the battery 10 has a SOC extremely close to 100% and a state in which it can be determined that the battery 10 is not to be charged anymore. Specifically, the full charge determinator 150 may determine a state in which the SOC of the battery 10 reaches an upper limit value, which is set to suppress degradation of the battery 10, to be "full charge". A determination result of the full charge determinator 150 is configured to be outputted to the charge controller 160.

The charge controller 160 is configured to control the charge of the battery 10 performed by the charger. In particular, the charge controller 160 according to the embodiment is configured to stop the charge of the battery 10 depending on the determination result of the full charge determinator 150.

(2) Explanation of Operation

Figure 13:
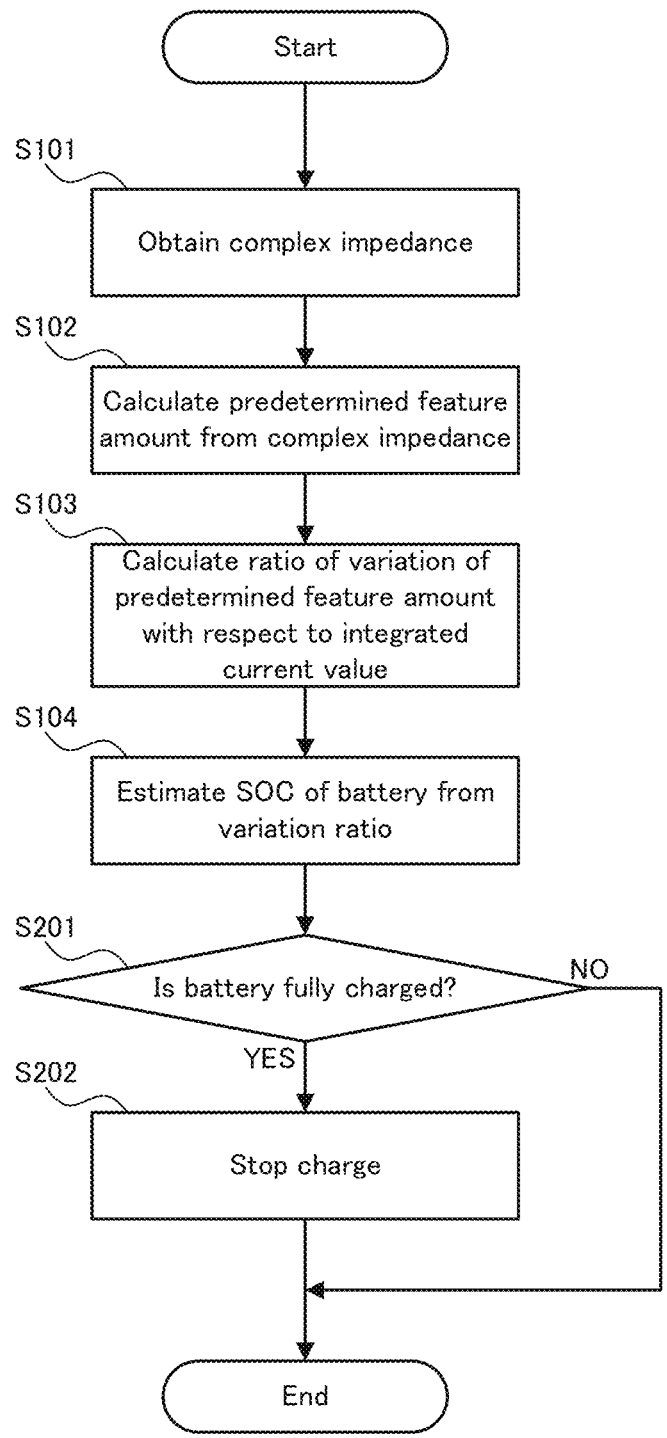
FIG. 13 is a flowchart illustrating a flow of operation of the battery state estimating apparatus according to the second embodiment.

Next, the operation of the battery state estimating apparatus 200 according to the second embodiment will be explained with reference to FIG. 13. FIG. 13 is a flowchart illustrating a flow of the operation of the battery state estimating apparatus 200 according to the second embodiment. FIG. 13 carries the same reference numerals as those for the same steps illustrated in FIG. 2. The following process shall be started in a state in which the battery 10 is charged.

As illustrated in FIG. 13, in operation of the battery state estimating apparatus 200 according to the second embodiment, the impedance acquirer 110 firstly obtains the complex impedance of the battery 10 (the step S101), and the feature amount calculator 120 calculates the predetermined feature amount from the obtained complex impedance (the step S102). The ratio calculator 130 calculates the variation ratio (the step S103), and estimates a current SOC of the battery 10 on the basis of the variation ratio (the step S104). In other words, so far, the same process as in the first embodiment is performed.

Particularly in the second embodiment, after the estimation of the SOC of the battery 10 by the battery state estimator 140, the full charge determinator 150 determines whether or not the battery 10 is fully charged (step S201). If the battery 10 is close to be fully charged, as illustrated in FIG. 8 to FIG. 11, the variation ratio of the predetermined feature amount starts to change, relatively significantly. The battery state estimator 140 may thus determine a situation in which a change in the variation ratio exceeds a predetermined threshold value, as a situation in which the battery 10 is fully charged. In this case, the estimation of the SOC by the battery state estimator 140 (i.e. a process of estimating a specific value of the SOC) may be omitted.

If it is determined that the battery 10 is fully charged (the step S201: YES), the charge controller 160 stops the charge control of the batter 10 (step S202). On the other hand, if it is determined that the battery 10 is not fully charged (the step S201: NO), the charge controller 160 does not stop the charge control of the batter 10 (i.e. the charge control of the batter 10 is continued).

As explained above, according to the battery state estimating apparatus 200 in the second embodiment, it is possible to suppress overcharge of the battery 10 by using the SOC of the battery 10 estimated from the predetermined feature amount.

Third Embodiment

A battery state estimating apparatus according to a third embodiment will be explained. The third embodiment is partially different from the first and second embodiments in operation, and the other part is substantially the same. Thus, hereinafter, a different part from those of the first and second embodiments explained above will be explained in detail, and an explanation of the same part will be omitted.

(1) Calculation of Predetermined Feature Amount

Figure 14:
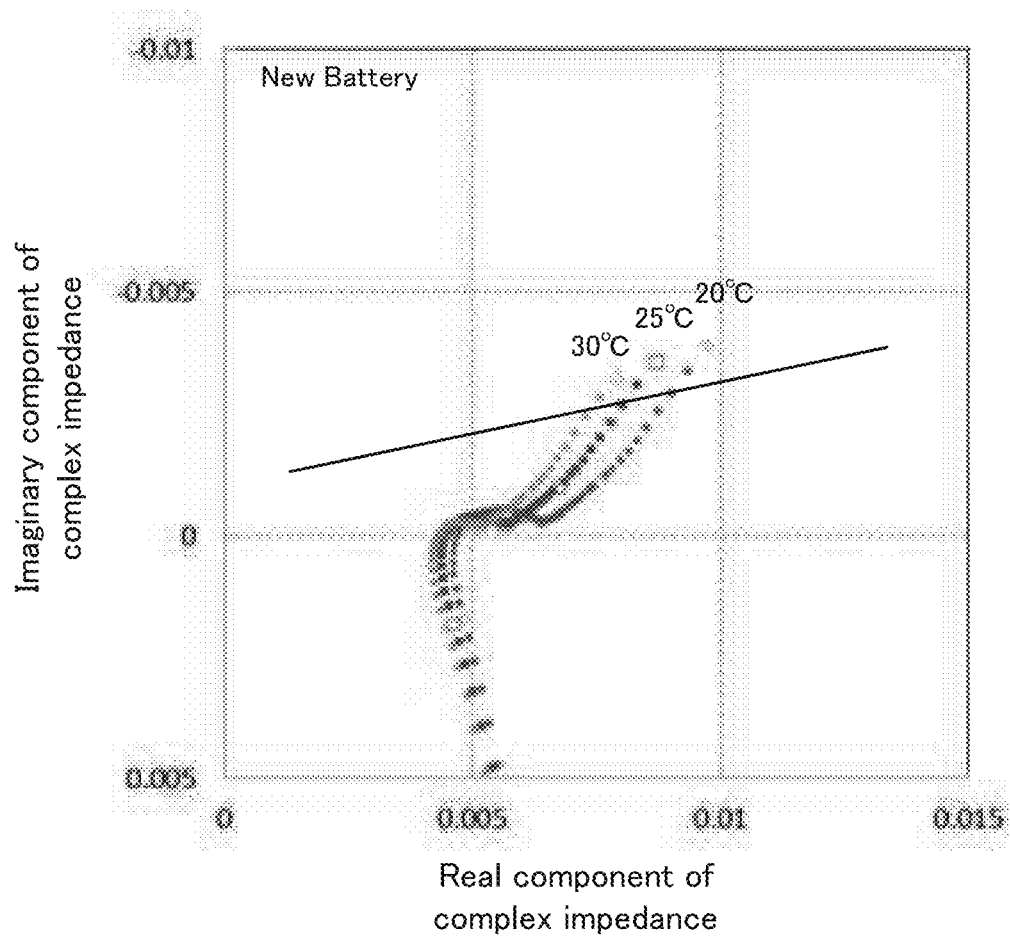
FIG. 14 is a graph illustrating one example of the complex impedance of a new battery at a plurality of temperatures.
Figure 15:
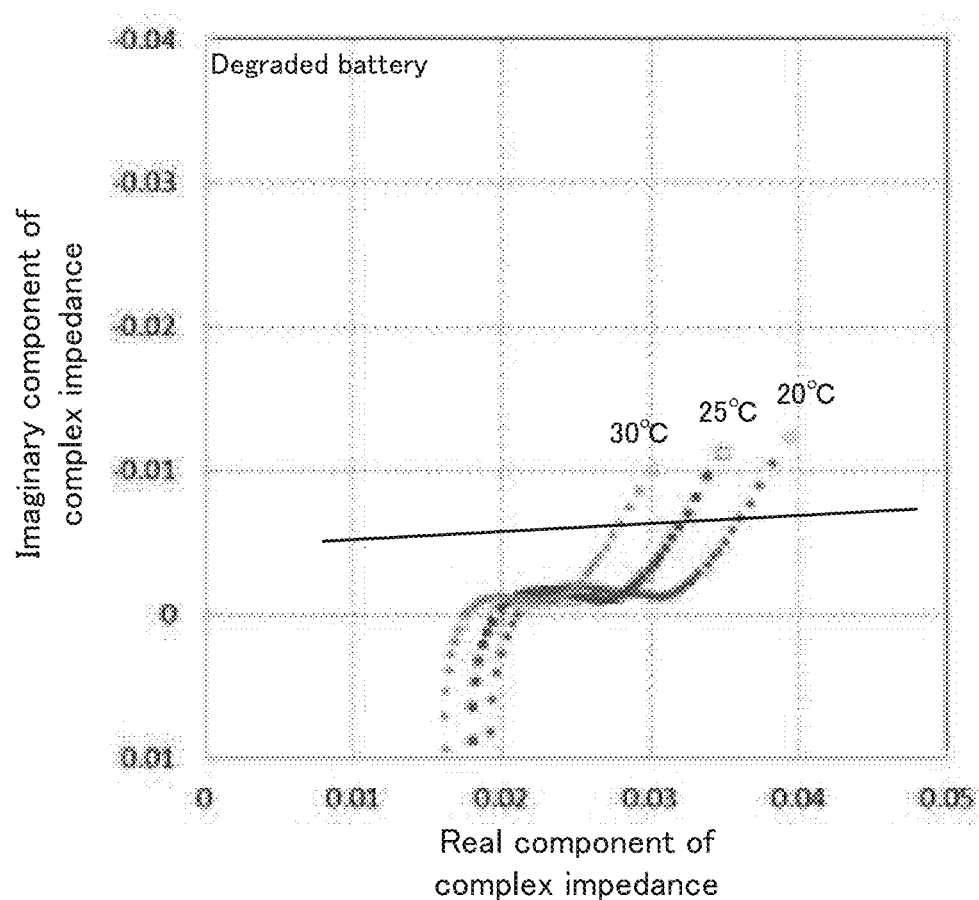
FIG. 15 is a graph illustrating one example of the complex impedance of a degraded battery at a plurality of temperatures.

A method of obtaining the complex impedance and a method of calculating the predetermined feature amount on the battery state estimating apparatus according to the third embodiment will be explained with reference to FIG. 14 and FIG. 15. FIG. 14 is a graph illustrating one example of the complex impedance of a new battery at a plurality of temperatures. FIG. 15 is a graph illustrating one example of the complex impedance of a degraded battery at a plurality of temperatures. Each of FIG. 14 and FIG. 15 illustrates the complex impedance that is obtained in substantially the same SOC of the battery 10.

As illustrated in FIG. 14 and FIG. 15, in operation of the battery state estimating apparatus 100 according to the third embodiment, the impedance acquirer 110 may obtain the complex impedance of the battery 10 under a plurality of temperature conditions in which the battery 10 has different internal temperatures. In other words, the impedance acquirer 110 may obtain a plurality of complex impedances corresponding to different temperatures. In FIG. 14 and FIG. 15, for convenience of explanation, the temperature of the battery 10 is accurately known to be 30 degrees C., 25 degrees C., and 20 degrees C. It is, however, not necessarily required to know the accurate temperature of the battery 10. In other words, as long as the complex impedances are obtained at different temperatures, specific temperature values could be unknown.

After the acquisition of the complex impedances at the plurality of different temperatures, the feature amount calculator 120 may calculate a slope of the complex impedance from the obtained plurality of complex impedances. If the complex impedances obtained when the battery 10 has temperatures of 30 degrees C., 25 degrees C., and 20 degrees C. are plotted on a complex plane, the complex impedances are drawn as different curves that are shifted to the right with decreasing temperature. The feature amount calculator 120 may calculate a slope of a straight line connecting values of the complex impedances corresponding to a second predetermined frequency (which is specifically an approximate straight line derived from the values), as the slope of the complex impedance. The "second predetermined frequency" may be set in advance to calculate the slope of the complex impedance, and may be selected, as occasion demands, from the frequency range of the AC voltage that is applied to the battery 10 to obtain the complex impedance.

As is clear from a comparison between FIG. 14 (data about a new battery) and FIG. 15 (data about a degraded battery), a significant difference can be found in the predetermined feature amount as calculated above (i.e. the slope of the straight line in each of the drawings), depending on the degradation state of the battery 10. Specifically, even in substantially the same SOC of the battery 10, the slope of the straight line, which is the predetermined feature amount, varies significantly depending on the degradation state of the battery 10. According to the studies by the present inventors, however, it has been found that such a predetermined feature amount exhibits the same tendency as the predetermined feature amount according to the first embodiment explained above.

(2) Relation Between SOC and Predetermined Feature Amount

Figure 16:
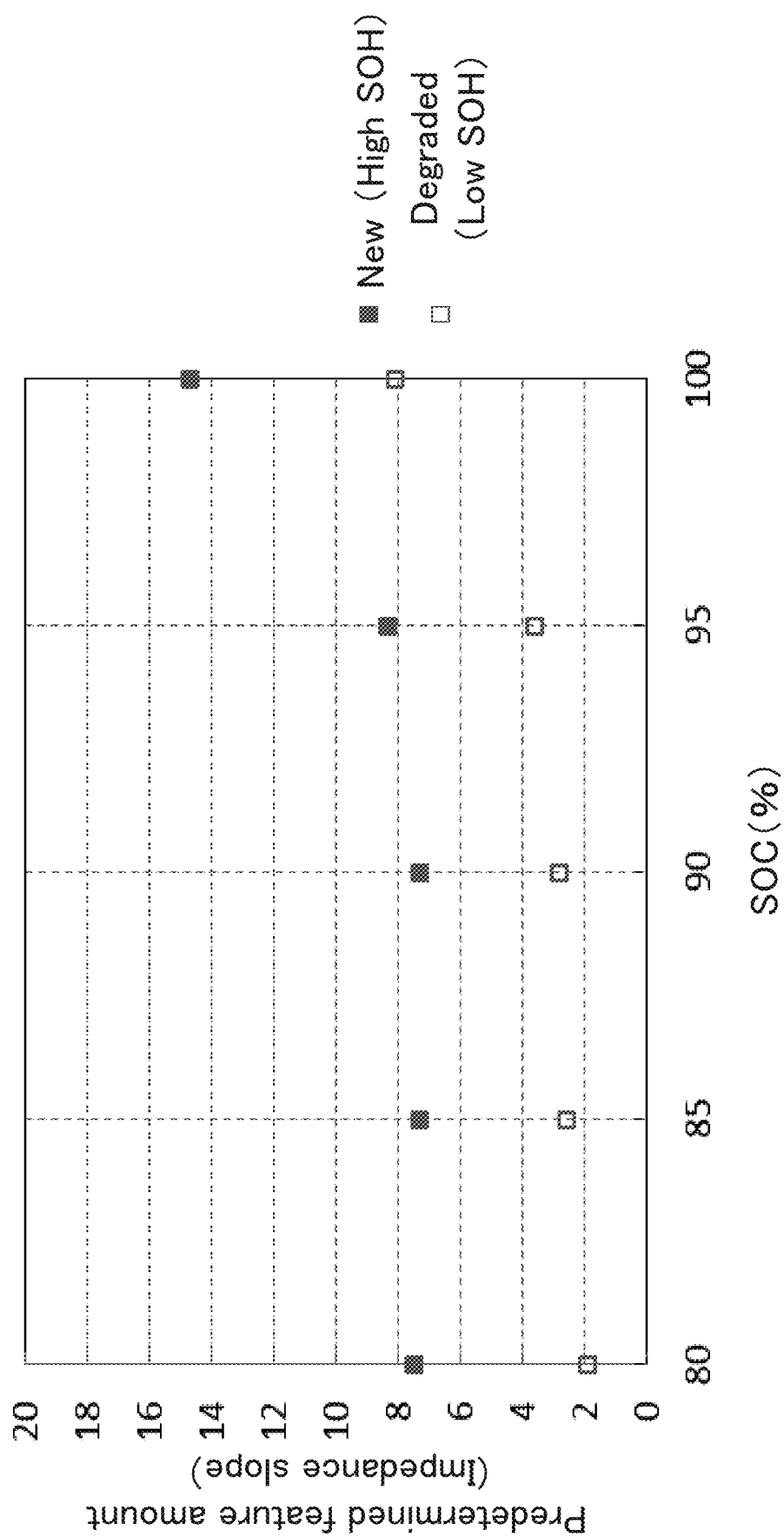
FIG. 16 is a map illustrating a relation between a predetermined feature amount and the battery SOC according to a third embodiment.
Figure 17:
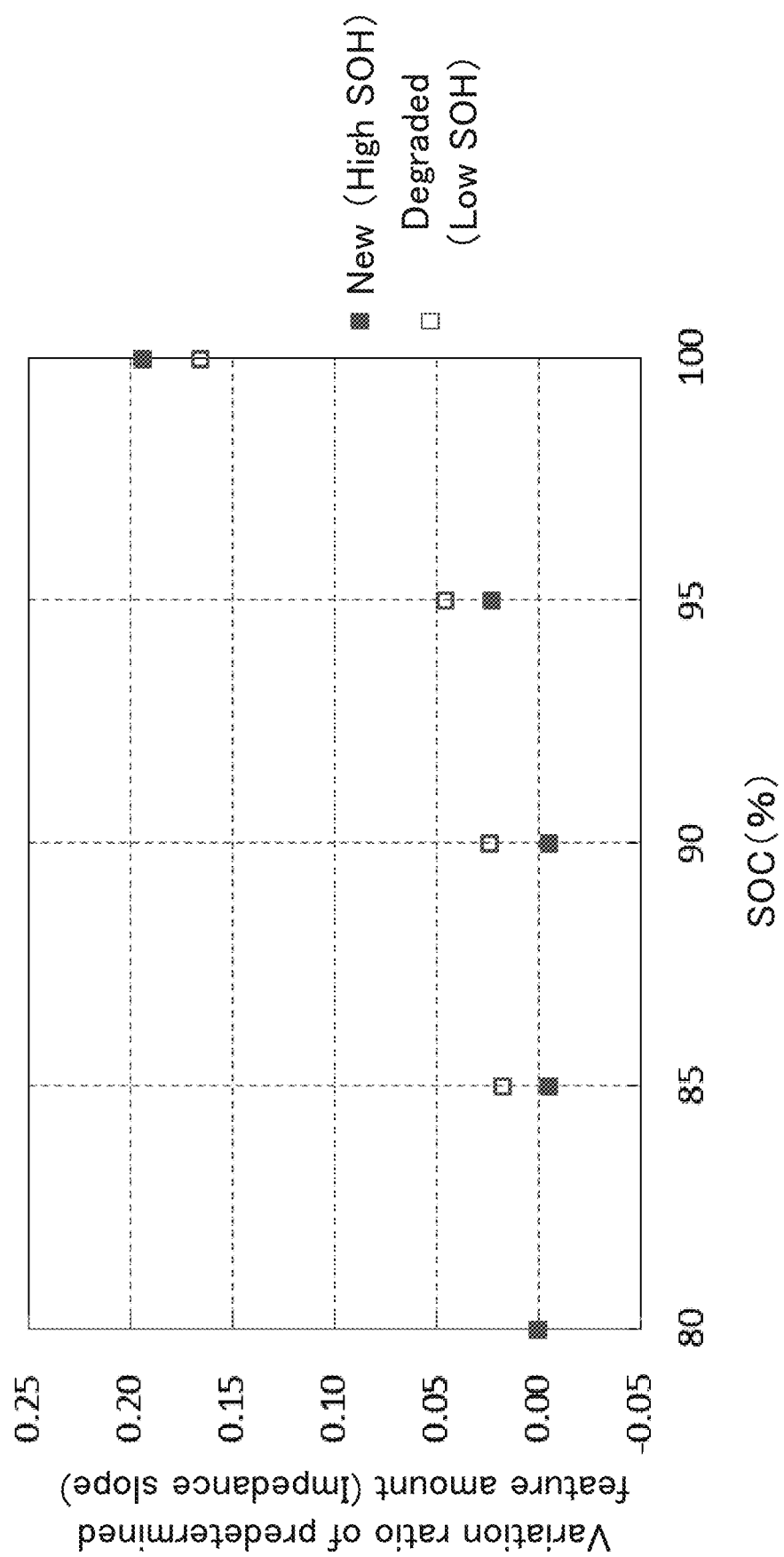
FIG. 17 is a map illustrating a relation between a variation ratio of the predetermined feature amount and the battery SOC according to the third embodiment.

Hereinafter, a relation between the SOC of the battery 10 and the predetermined feature amount will be explained with reference to FIG. 16 and FIG. 17. FIG. 16 is a map illustrating a relation between the predetermined feature amount and the battery SOC according to the third embodiment. FIG. 17 is a map illustrating a relation between the variation ratio of the predetermined feature amount and the battery SOC according to the third embodiment.

As illustrated in FIG. 16, depending on whether the battery 10 is new (i.e. a rarely degraded battery) or is degraded (i.e. a degraded battery due to long-term use), a significant difference can be found in the relation between the slope of the straight line, which is the predetermined feature amount, and the SOC of the battery 10. It is thus hard to estimate the SOC of the battery 10 from the predetermined feature amount if the degradation state of the battery 10 (e.g. SOH) is not known.

On the other hand, as illustrated in FIG. 17, regardless of whether the battery 10 is new or degraded, no significant difference can be found in the relation between the variation ratio of the slope of the straight line, which is the predetermined feature amount, and the SOC of the battery 10. It is thus possible to estimate the SOC regardless of the degradation state of the battery 10, by using the variation ratio of the predetermined feature amount.

The value of the complex impedance of the battery 10 basically has a temperature dependence. In the third embodiment, as explained in FIG. 14 and FIG. 15, the predetermined feature amount is calculated by using the plurality of complex impedances obtained at different temperatures. Thus, the relation between the predetermined feature amount and the SOC rarely has the temperature dependence. In other words, even if the temperature of the battery 10 is changed, there is little change in the relations illustrated in FIG. 16 and FIG. 17. It is therefore possible to accurately estimate the SOC of the battery 10, even when there is a variation in the internal temperature in each part of the battery 10, which is, for example, a solution-based battery, and the temperature is hardly appropriately detected.

As explained above, according to the battery state estimating apparatus in the third embodiment, it is possible to accurately estimate the SOC of the battery 10 while certainly eliminating an influence of the temperature dependence, by using the predetermined feature amount, which is calculated from the plurality of complex impedances.

Fourth Embodiment

A battery state estimating apparatus according to a fourth embodiment will be explained. The fourth embodiment is partially different from the aforementioned third embodiment in operation, and the other part is substantially the same. Thus, hereinafter, a different part from that of the third embodiment explained above will be explained in detail, and an explanation of the same part will be omitted.

(1) Correction of Predetermined Feature Amount

Figure 18:
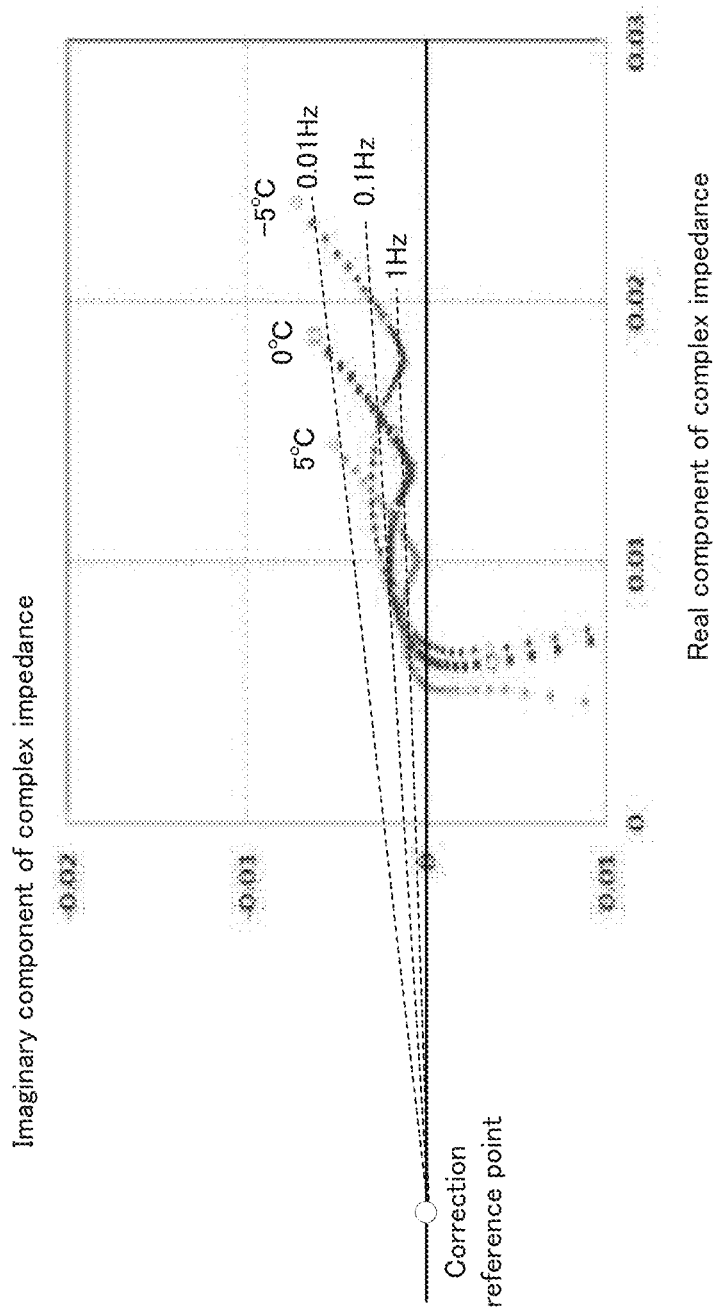
FIG. 18 is a graph illustrating intersections of straight lines indicating the predetermined feature amount and an X axis.
Figure 19:
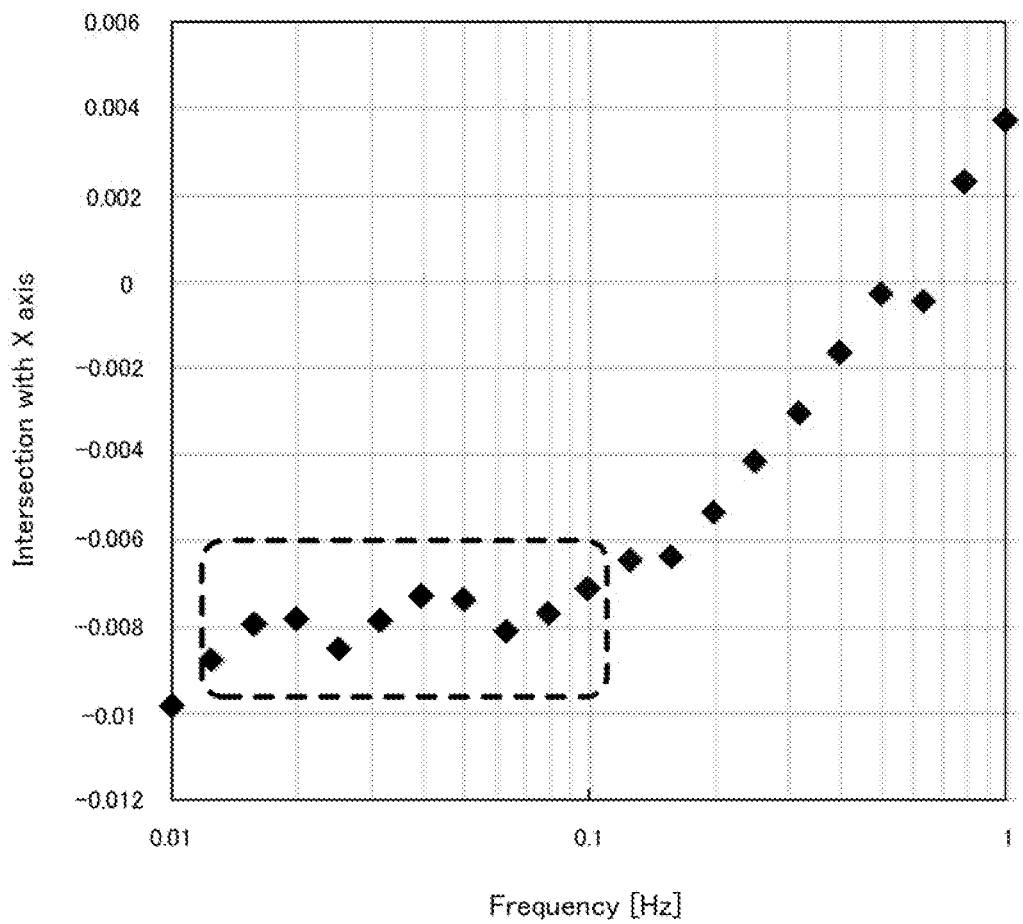
FIG. 19 is a graph illustrating that a distribution of the intersections of the straight lines and the X axis converges in a particular frequency band.

Correction of the predetermined feature amount performed on the battery state estimating apparatus according to the fourth embodiment will be explained with reference to FIG. 18 and FIG. 19. FIG. 18 is a graph illustrating intersections of straight lines indicating the predetermined feature amount and an X axis. FIG. 19 is a graph illustrating that a distribution of the intersections of the straight lines and the X axis converges in a particular frequency band.

As illustrated in FIG. 18, in calculating the predetermined feature amount according to the fourth embodiment, a straight line (or specifically, an approximate straight line) connecting values corresponding to a third predetermined frequency of the complex impedances obtained at different temperatures may be calculated, and an intersection of the straight line and an X axis on a complex plane may be calculated. The "third predetermined frequency" may be set in advance to determine a correction reference point, and may be selected, as occasion demands, from the frequency range of the AC voltage that is applied to the battery 10 to obtain the complex impedance. A plurality of third predetermined frequencies may be set to calculate a plurality of straight lines. The third predetermined frequency may include the second predetermined frequency.

In the example illustrated in FIG. 18, three third predetermined frequencies are set, which are 0.01 Hz, 0.1 Hz, and 1 Hz, and three straight lines and three intersections of the three straight lines and the X axis are calculated. According to the studies by the present inventors, it has been found that the intersections of the plurality of straight lines and the X axis converge on one point in a particular frequency range.

As illustrated in FIG. 19, the intersections may converge on an extremely narrow area in a range of the third predetermined frequency of 0.01 Hz to 0.1 Hz. A point corresponding to a convergence value on which the intersections converge in this manner may be determined to be the correction reference point. For example, a value obtained by averaging positions of the intersections that converge (i.e. intersections surrounded by a dashed line) may be determined to be a position of the correction reference point. The correction reference point is one specific example of the "reference point".

After the determination of the correction reference point, the predetermined feature amount calculated by the feature amount calculator 120 may be corrected on the basis of the correction reference point. More specifically, a slope of a straight line (or specifically, an approximate straight line) connecting the correction reference point and values corresponding to any of the second predetermined frequencies of the complex impedances may be determined to be the predetermined feature amount. In other words, the predetermined feature amount may be corrected as a slope of a straight line passing through the correction reference point.

In the aforementioned example, the plurality of third predetermined frequencies are set, and the point at which the plurality of intersections converge is determined to be the correction reference point. One third predetermined frequency may be set to determine a calculated intersection to be a correction reference.

(2) Technical Effect of Correction

Figure 20:
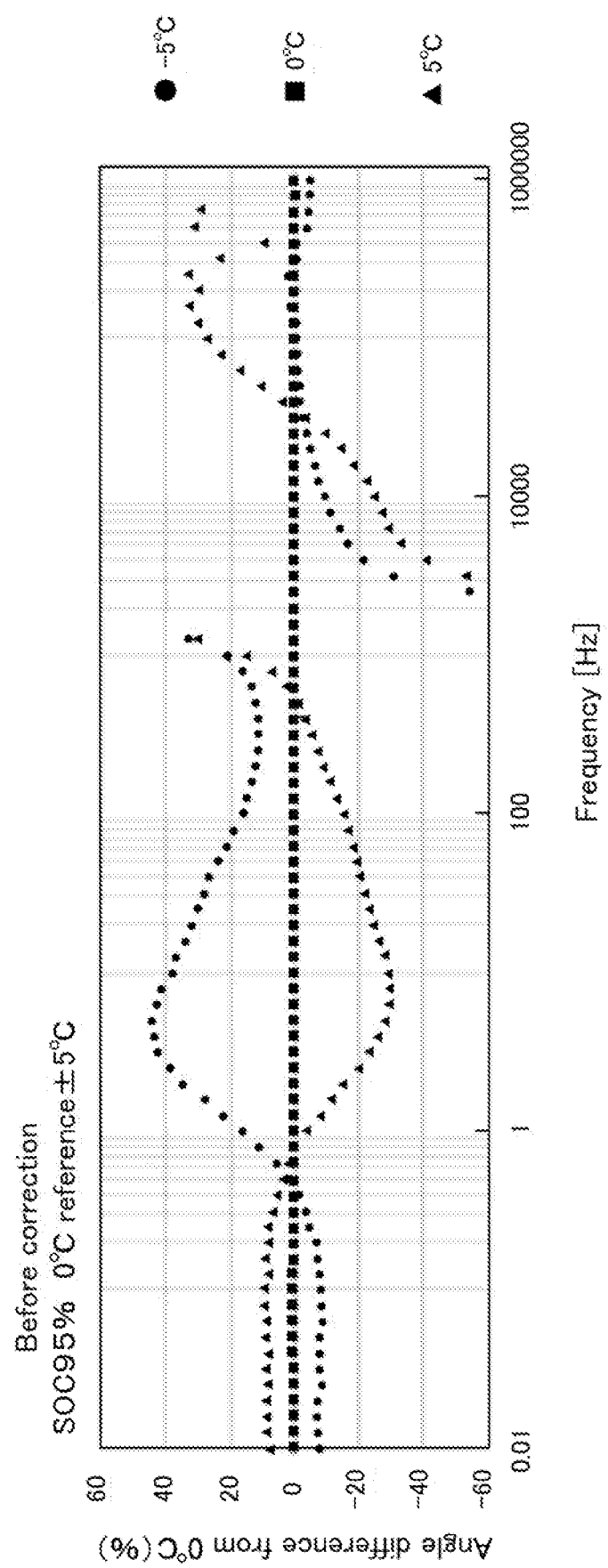
FIG. 20 is a Bode diagram indicating frequency characteristics of the predetermined feature amount before correction.
Figure 21:
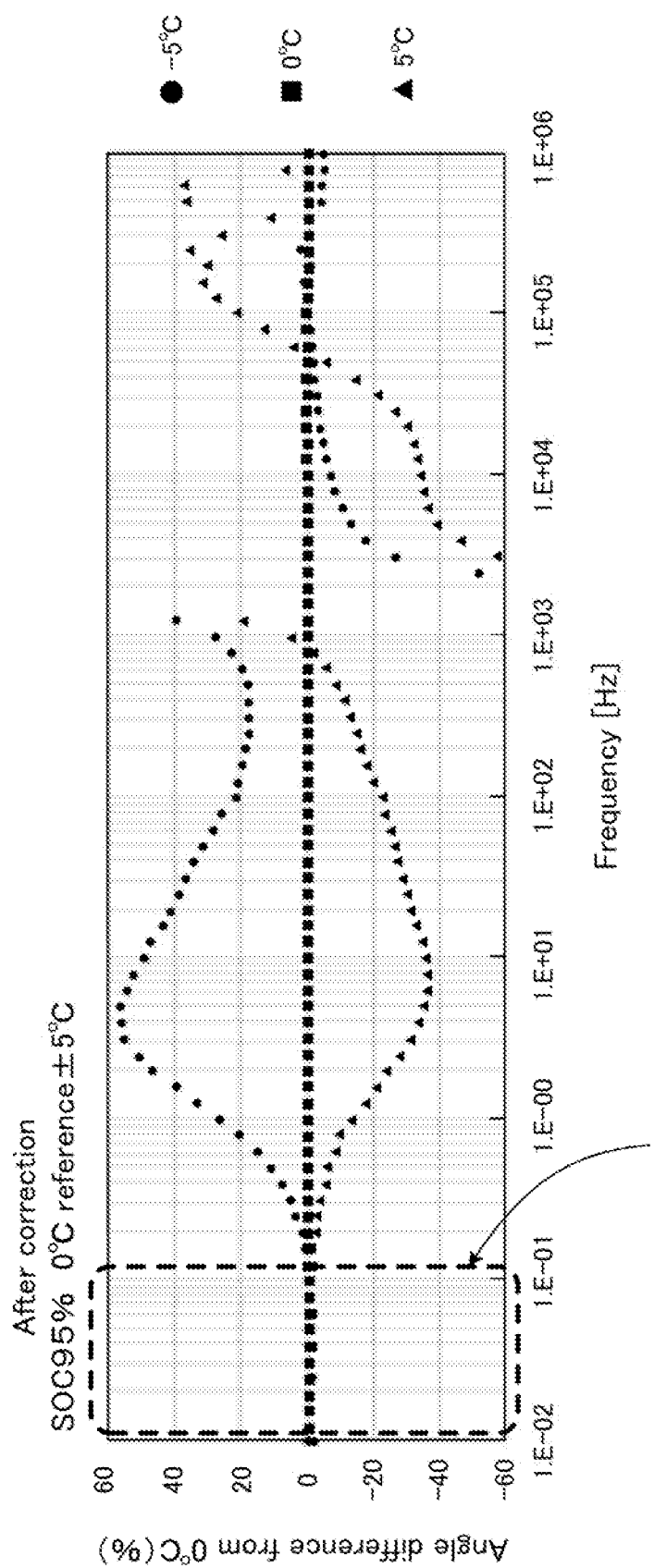
FIG. 21 is a Bode diagram indicating frequency characteristics of the predetermined feature amount after the correction.
Figure 22:
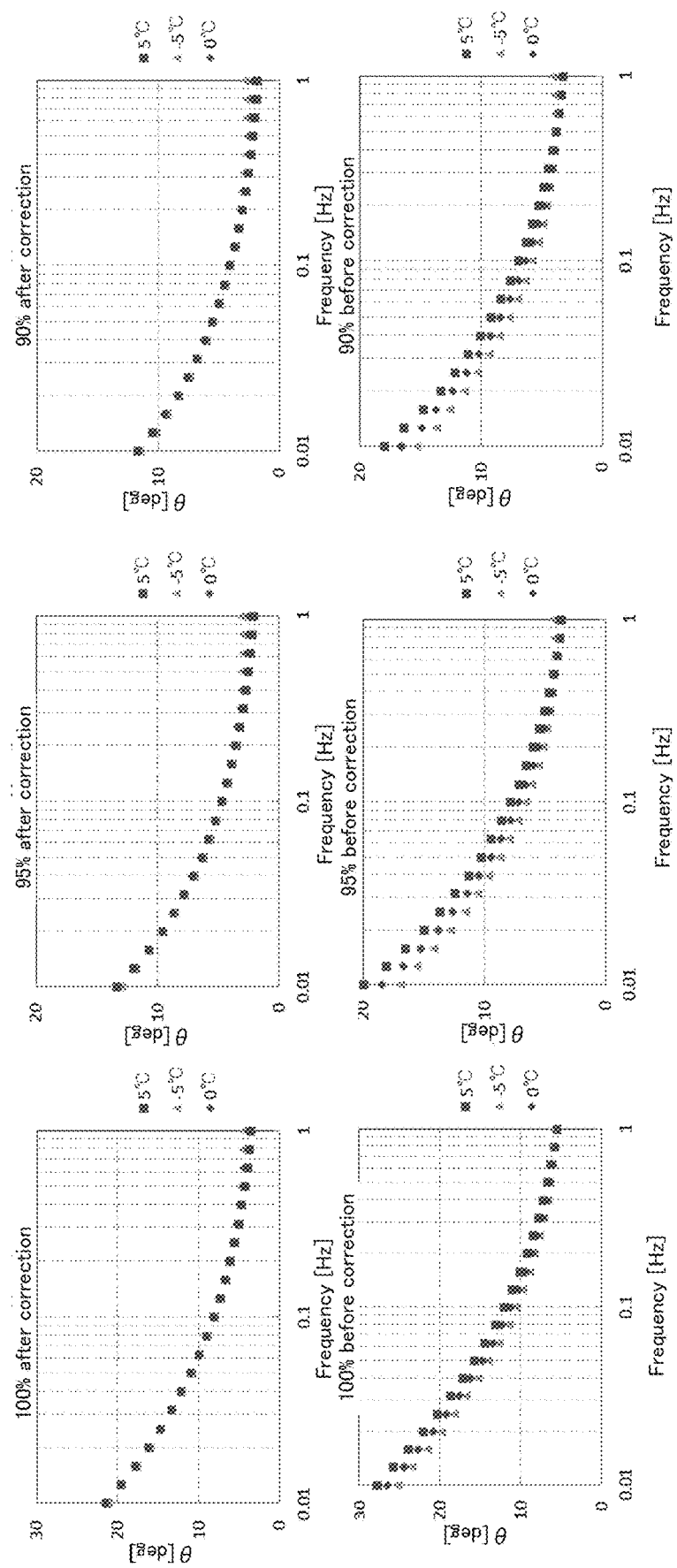
FIG. 22 are Bode diagrams indicating frequency characteristics of the predetermined feature amount before the correction and after the correction, for each SOC.

Next, technical effect obtained by the correction using the correction reference point will be explained in detail with reference to FIG. 20 to FIG. 22. FIG. 20 is a Bode diagram indicating frequency characteristics of the predetermined feature amount before the correction. FIG. 21 is a Bode diagram indicating frequency characteristics of the predetermined feature amount after the correction. FIG. 22 are Bode diagrams indicating frequency characteristics of the predetermined feature amount before the correction and after the correction, for each SOC.

As illustrated in FIG. 20, the predetermined feature amount before the correction has such frequency characteristics that there is an angle difference (or slope difference) to some extent in any case of 5 degrees C. and −5 degrees C. based on 0 degrees C. This indicates that the influence of the temperature dependence cannot be completely eliminated by simply calculating the slope of the complex impedance from the straight line connecting the values corresponding to the second predetermined frequency.

In contrast, as illustrated in FIG. 21, the predetermined feature amount after the correction has such frequency characteristics that there is no angle difference based on 0 degrees C. in a range of 0.01 Hz to 0.1 Hz (or a range surrounded by a dashed line in the drawing). This indicates that the influence of the temperature dependence can be almost completely eliminated in the range of 0.01 Hz to 0.1 Hz by using the straight line passing through the correction reference point to correct the predetermined feature amount.

As illustrated in FIG. 22, it is clear that the variation generated in the predetermined feature amount (or an angle $\vartheta$ of the straight line) before the correction due to the temperature difference is eliminated after the correction, even when the SOC is changed to 100%, 95%, and 90%. As described above, the influence of the temperature dependence can be more preferably eliminated by using the correction reference point to correct the predetermined feature amount.

As explained above, according to the battery state estimating apparatus in the fourth embodiment, it is possible to more certainly eliminate the influence of the temperature dependence by using the correction reference point to correct the predetermined feature amount. It is therefore possible to accurately estimate the SOC of the battery 10 without considering the temperature of the battery 10.

The invention may be embodied in other specific forms without departing from the spirit or essential characteristics thereof. The present embodiments and examples are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A battery state estimating apparatus comprising:
    an acquirer configured to obtain a complex impedance of a battery;
    a calculator configured to calculate a ratio of a variation of a predetermined feature amount from the complex impedance; and
    an estimator configured to estimate a charge amount of the battery on the basis of the ratio of the variation of the predetermined feature amount with respect to an integrated current value, which is an integrated value of an electric current flowing through the battery, wherein
    said calculator is configured to calculate the ratio of the variation of the predetermined feature amount by using, for the predetermined feature amount,
    (i) a real component of the complex impedance,
    (ii) an imaginary component of the complex impedance,
    (iii) an absolute value of the complex impedance, and
    (iv) a slope of a straight line connecting an origin on a complex plane and a value of the complex impedance at a first predetermined frequency, the complex plane having an axis that is a real component of the complex impedance and an axis that is an imaginary component of the complex impedance.

2. A battery state estimating apparatus comprising:
    an acquirer configured to obtain a complex impedance of a battery;
    a calculator configured to calculate a ratio of a variation of a predetermined feature amount from the complex impedance; and
    an estimator configured to estimate a charge amount of the battery on the basis of the ratio of the variation of the predetermined feature amount with respect to an integrated current value, which is an integrated value of an electric current flowing through the battery, wherein:
    said acquirer is configured to obtain a plurality of complex impedances at a plurality of different temperatures, and
    said calculator is configured to calculate the ratio of the variation of the predetermined feature amount by using, for the predetermined feature amount, a slope of a straight line connecting values of the obtained plurality of complex impedances at a second predetermined frequency on a complex plane having an axis that is a real component of the complex impedance and an axis that is an imaginary component of the complex impedance.

3. The battery state estimating apparatus according to claim 2, further comprising:
    a determinator configured to determine an intersection of a straight line connecting values of the obtained plurality of complex impedances at a third predetermined frequency and the axis that is the real component, to be a reference point; and
    a corrector configured to correct the predetermined feature amount calculated on said calculator, to a slope of a straight line connecting the reference point and the values of the obtained plurality of complex impedances at the second predetermined frequency.

4. The battery state estimating apparatus according to claim 3, wherein
    said determinator is configured to calculate a plurality of intersections by changing the third predetermined frequency and is configured to determine a point corresponding to a convergence value on which a distribution of the calculated plurality of intersections converges, to be the reference point.

* * * * *